United States Patent [19]

Takayama et al.

[11] Patent Number: 5,751,756

[45] Date of Patent: May 12, 1998

[54] SEMICONDUCTOR LASER DEVICE FOR USE AS A LIGHT SOURCE OF AN OPTICAL DISK OR THE LIKE

[75] Inventors: Toru Takayama, Nara; Osamu Imafuji, Osaka; Masaaki Yuri, Kyoto; Masahiro Kume, Shiga; Akio Yoshikawa, Kyoto, all of Japan

[73] Assignee: Matsushita Electronics Corporation, Osaka, Japan

[21] Appl. No.: 707,566

[22] Filed: Sep. 4, 1996

[30] Foreign Application Priority Data

Sep. 5, 1995 [JP] Japan ................................ 7-228080

[51] Int. Cl.$^6$ .................................................. H01S 3/19
[52] U.S. Cl. ............................................. 372/46; 372/45
[58] Field of Search ............................................. 372/45, 46

[56] References Cited

U.S. PATENT DOCUMENTS

| | | | |
|---|---|---|---|
| 4,800,565 | 1/1989 | Yoshizawa et al. | 372/46 |
| 5,065,404 | 11/1991 | Okajima et al. | 372/45 |
| 5,208,824 | 5/1993 | Tsang | 372/45 |
| 5,297,158 | 3/1994 | Naitou et al. | 372/45 |
| 5,416,790 | 5/1995 | Yodoshi et al. | 372/46 |

FOREIGN PATENT DOCUMENTS

| | | |
|---|---|---|
| 6-196801 | 7/1994 | Japan. |
| 6-196810 | 7/1994 | Japan. |

Primary Examiner—Rodney R. Bovernick
Assistant Examiner—Luong-Quyen T. Phan
Attorney, Agent, or Firm—McDermott, Will & Emery

[57] ABSTRACT

A buffer layer composed of an n-type semiconductor layer, a cladding layer composed of an n-type semiconductor layer, and an active layer are formed sequentially on an n-type semiconductor substrate. On the active layer, there are formed a first optical guiding layer composed of a p-type semiconductor layer including a loss varying layer composed of a p-type semiconductor layer having a bandgap smaller than that of the active layer and a second optical guiding layer composed of a p-type semiconductor layer in this order. On the second optical guiding layer, there is formed a third optical guiding layer composed of a p-type semiconductor layer extending in a stripe. On both sides of the third optical guiding layer on the second optical guiding layer, there are formed current blocking layers which become transparent to a lasing light generated in the active layer composed of the n-type semiconductor layer.

28 Claims, 21 Drawing Sheets

SEMICONDUCTOR LASER DEVICE FOR USE AS A LIGHT SOURCE OF AN OPTICAL DISK OR THE LIKE

BACKGROUND OF THE INVENTION

The present invention relates to a semiconductor laser device having a small astigmatism, a low-noise characteristic, and a low operating current suitably for use as a light source of an optical disk or the like.

Below, a description will be given to conventional semiconductor laser devices.

FIG. 20 is a cross-sectional view of a first conventional semiconductor laser device disclosed in Japanese Laid-Open Patent Publication HEI 6-196801. As shown in the drawing, a buffer layer 2 composed of n-type GaAs, a cladding layer 3 composed of n-type gallium aluminum arsenide ($Ga_{0.5}Al_{0.5}As$), and an active layer 4 composed of undoped $Ga_{0.85}Al_{0.15}As$, a first optical guiding layer 5 composed of p-type $Ga_{0.5}Al_{0.5}As$, and a second optical guiding layer 6 composed of p-type $Ga_{0.8}Al_{0.2}As$ are formed sequentially on a semiconductor substrate 1 composed of n-type gallium arsenide (GaAs). To confine an injected current, current blocking layers 7 are formed on the entire surface of the second optical guiding layer 6 except for a portion thereof corresponding to a stripe region 7a serving as a current channel. Over the stripe region 7a and the current blocking layers 7, there are formed a protecting layer 8 composed of $Ga_{0.8}Al_{0.2}As$, a cladding layer 9 composed of p-type $Ga_{0.5}Al_{0.5}As$, and a contact layer 10 composed of p-type GaAs in this order.

In the conventional semiconductor laser device shown in FIG. 20, the current injected through the contact layer 10 composed of p-type GaAs is effectively confined in the stripe region 7a to cause laser oscillation in the active layer 4 composed of $Ga_{0.85}Al_{0.15}As$ underlying the stripe region 7a. Since the refractive index of the current blocking layer 7 composed of n-type $Ga_{0.4}Al_{0.6}As$ is smaller than that of the cladding layer 9 composed of p-type $Ga_{0.5}Al_{0.5}As$ during the process, a lasing light is also confined effectively in the stripe region 7a, resulting in laser oscillation in a single transverse mode at a wavelength of about 780 nm.

Moreover, since the bandgap of the current blocking layer 7 composed of n-type $Ga_{0.4}Al_{0.6}As$ is sufficiently larger than the bandgap of the active layer 4 composed of $Ga_{0.85}Al_{0.15}As$, the current blocking layer 7 composed of n-type $Ga_{0.4}Al_{0.6}As$ becomes transparent to the lasing light, so that a semiconductor laser having a small internal loss and a low operating current is provided.

Furthermore, since the current blocking layer 7 composed of n-type $Ga_{0.4}Al_{0.6}As$ becomes transparent to the lasing light, the near field pattern can be extended to the outside of the stripe region 7a by adjusting structural parameters including the AlAs composition of the current blocking layer 7 and the thickness of the first optical guiding layer 5. This enables the fabrication of a semiconductor laser device in which a saturable absorbing region is formed easily and self-sustained pulsation is induced easily, while a low-noise characteristic is provided thereby.

FIG. 21 shows a cross-sectional structure of a second conventional semiconductor laser device disclosed in Japanese Laid-Open Patent Publication HEI 6-196810, which accomplishes self-sustained pulsation. As shown in the drawing, a first cladding layer 22 composed of n-type gallium aluminum arsenide (GaAlAs), a first saturable absorbing layer 23 composed of n-type GaAlAs, a second cladding layer 24 composed of n-type GaAlAs, an active layer 25 composed of undoped GaAlAs, a third cladding layer 26 composed of p-type GaAlAs, and a second saturable absorbing layer 27 composed of p-type GaAlAs are formed sequentially on a semiconductor substrate 21 composed of n-type gallium arsenide (GaAs). On the central portion of the second saturable absorbing layer 27, there is formed a fourth cladding layer 28 composed of p-type GaAlAs and shaped like a ridge extending in a stripe and having a height of 0.5 µm to 1 µm and a bottom width of 4 µm. On top of the fourth cladding layer 28, there is formed a capping layer 29 composed of p-type GaAs and having a thickness of 0.15 µm. Current blocking layers 30 each composed of n-type GaAs and having a thickness of 0.8 µm are formed on both sides of the fourth cladding layer 28 and the capping layer 29 on the second saturable absorbing layer 27. On the current blocking layers 30 and the capping layer 29, there is formed a contact layer 31 composed of p-type GaAs and having a thickness of 4 µm.

In the second conventional semiconductor laser device shown in FIG. 21, the current injected through the contact layer 31 is effectively confined in the ridge-shaped fourth cladding layer 28 extending in a stripe so that laser oscillation occurs in a region of the active layer 25 underlying the fourth cladding layer 28. In this case, since the current blocking layers 30 absorb a lasing light, the near field pattern is effectively confined in the fourth cladding layer 28. On the other hand, the bandgap energy of each of the first and second saturable absorbing layers 23 and 27 is made roughly equal to the bandgap energy of the active layer 25 so that each of the first and second saturable absorbing layers 23 and 27 exhibits saturable absorption to the lasing light, which causes the semiconductor laser to perform self-sustained pulsation.

In applying the first conventional semiconductor laser device shown in FIG. 20 to an optical disk, there are cases where a multimode spectrum is produced to cause self-sustained pulsation and thereby provide a satisfactory low-noise characteristic. In these cases, the near field distribution should be horizontally expanded to the region of the active layer 4 underlying the current blocking layer 7 into a saturable absorbing region, so that it becomes necessary to considerably reduce the difference between effective refractive indices inside and outside the stripe region 7a.

However, since the refractive index inside the stripe region 7a decreases due to a plasma effect during laser oscillation, it is required to set the difference between the effective refractive indices inside and outside the stripe region 7a at a large value of, e.g., $6 \times 10^{-3}$ or more in order to provide stable fundamental transverse mode operation.

To achieve self-sustained pulsation in the first conventional semiconductor laser device, however, the difference in effective refractive index should be on the order of $3 \times 10^{-3}$, which not only deforms the transverse mode in high-power operation but also causes a great loss increase in the active layer, resulting in an undesired increase in operating current.

In addition, the wavefront propagated along the waveguide is bent by a light absorption loss in the saturable absorbing region composed of the region of the active layer 4 underlying the current blocking layer 7, which disadvantageously produces an astigmatic distance of 10 µm or more when the lasing light is focused by a lens.

The deformation of the transverse mode or the presence of the astigmatic distance when the lasing light is focused may result in spot size reduced only insufficiently in the application of the semiconductor laser device to an optical disk, which causes a serious problem.

In the second conventional semiconductor laser device shown in FIG. 21, GaAs which absorbs lasing light is used for the current blocking layers 30 to confine the near field pattern in the stripe region inside the current blocking layers 30. However, since the current blocking layers 30 absorb the lasing light, the wavefront propagated along the waveguide is bent by the light absorption loss, so that an astigmatic distance of 10 µm or more is produced disadvantageously. Moreover, non-linearity is observed in the current-versus-light-output characteristic in low-power operation, so that the semiconductor laser device presents a serious problem when used as a light source of an optical pickup device of an optical disk or the like. Although a typical light output preferred in reading information from the optical disk is about 3 mW, a slight increase in the injected current after laser oscillation drastically increases the light output to about 5 mW, so that it becomes difficult to maintain the light output necessary for reading at a constant value.

Although typical light outputs preferred in reading and writing information from and in the optical disk or the like are about 3 mW and 30 mW, respectively, a current-versus-light-output characteristic with excellent linearity cannot be obtained in an optical pickup device using, as the light source, the second conventional semiconductor laser device shown in FIG. 21 when the light output ranges between 3 mW and 30 mW, so that it has been difficult to use the semiconductor laser device in the optical pickup device.

In order to increase the light utilization factor, the NA (Numerical Aperture) on the laser side of the lens is designed to be higher than the NA of a CD (Compact Disk) in a writable optical pickup device, so that the semiconductor laser device is easily influenced by the astigmatic distance. Consequently, the difference between the value of the astigmatic distance in reading operation during which the light output is 3 mW and the value of the astigmatic distance in writing operation during which the light output is 30 mW is increased, so that the beam emitted from the semiconductor laser device and focused by the lens does not result in a small spot. To compensate for the astigmatic distance, an additional optical part becomes necessary, which prevents the optical pickup device from being miniaturized at low cost. If the optical part for compensating for the astigmatic distance is not to be used, the astigmatic distance of the semiconductor laser device should be reduced to 5 µm or less. However, since the astigmatic distance is as large as 10 µm or more in the first and second conventional semiconductor laser devices shown in FIGS. 20 and 21, the optical part for compensating for the astigmatic distance is indispensable.

As described above, a high-power, low-noise semiconductor laser device stably oscillating in a transverse mode, having no astigmatic distance, and presenting a current-versus-light-output characteristic with excellent linearity has not previously been implemented.

SUMMARY OF THE INVENTION

It is therefore an object of the present invention to overcome the aforesaid problem and provide a high-power semiconductor laser device presenting a low-noise characteristic, stably oscillating with fundamental transverse mode even in high-power operation, having no astigmatic distance, and producing a light output that can easily be controlled even in low-power operation.

To attain the above object with first and second semiconductor laser devices of the present invention, a semiconductor layer having a bandgap equal to or smaller than the bandgap of an active layer is formed in an optical guiding layer overlying the active layer such that the semiconductor layer serving as a saturable absorbing region is formed in the direction of a resonator in a stripe region, while the near field pattern is confined in the stripe region by using current blocking layers which do not absorb the oscillated lasing light, thereby easily implementing a high-power, low-noise laser with a small astigmatic distance.

Specifically, the first semiconductor laser device comprises: an active layer composed of a semiconductor layer; a first optical guiding layer formed on the active layer and composed of a semiconductor layer of first conductivity type including at least one semiconductor layer having a bandgap equal to or less than a bandgap of the active layer; a second optical guiding layer composed of a semiconductor layer of first conductivity type formed on the first optical guiding layer; a third optical guiding layer composed of a semiconductor layer of first conductivity type formed in a stripe on the second optical guiding layer; and current blocking layers composed of semiconductor layers of second conductivity type formed on both sides of the third optical guiding layer on the second optical guiding layer, the current blocking layers becoming transparent to the lasing light generated in the active layer.

In the first semiconductor laser device, the first optical guiding layer includes at least one semiconductor layer having a bandgap equal to or smaller than the bandgap of the active layer and therefore serving as a saturable absorbing region, so that it is not necessary to cause a region of the active layer underlying the current blocking layer to serve as a saturable absorbing region. Consequently, it is not required to expand the near field pattern in the active layer in the lateral direction, while the saturable absorbing region required to provide self-sustained pulsation can be formed in a region outside the active layer underlying the stripe region. Hence, a semiconductor laser device wherein self-sustained pulsation is induced easily without depending on the structural parameters of the active layer can be fabricated with high production yield.

Moreover, oscillation in a fundamental transverse mode is achieved by adjusting the structural parameters of the individual semiconductor layers such that the difference between the effective refractive indices inside and outside the stripe region in the lateral direction becomes $6 \times 10^{-3}$ or more and thereby providing a stable effective-refractive-index waveguide mechanism. On the other hand, a small astigmatic distance is obtained by preventing the near field pattern from spreading out into the current blocking layer and thereby reducing the wavefront aberration of the propagated lasing light.

Furthermore, since the saturable absorbing region is formed in the direction of the resonator in the stripe region, even when the difference between the effective refractive indices inside and outside the stripe region is high, self-sustained pulsation is easily induced to provide low-noise characteristics.

In addition, since the current blocking layer is transparent under the radiation of a lasing light generated in the active layer, a semiconductor laser device with a reduced internal loss and a law operating current is provided.

The first semiconductor laser device is important as the light source of a writable optical disk since it performs high-power operation and self-sustained pulsation. In other words, since self-sustained pulsation produces a multimode oscillation spectrum during laser oscillation and provides a low-noise characteristics unaffected by reflected light from the optical disk, a circuit with an rf current superimposed thereon which has conventionally been required to produce a multimode oscillation spectrum is no more necessary, so that an optical pickup can be greatly miniaturized at lower cost.

Specifically, the second semiconductor laser device comprises: an active layer composed of a $Ga_{1-X}Al_XAs$ layer; a first optical guiding layer composed of a $Ga_{1-Y1}Al_{Y1}As$ layer of first conductivity type including at least one loss varying layer composed of a GaAlAs layer having a bandgap equal to or less than a bandgap of the active layer; a second optical guiding layer composed of a $Ga_{1-Y2}Al_{Y2}As$ layer of first conductivity type formed on the first optical guiding layer; a third optical guiding layer composed of a $Ga_{1-Y3}Al_{Y3}As$ layer of first conductivity type formed in a stripe on the second optical guiding layer; and current blocking layers composed of $Ga_{1-Z}Al_ZAs$ layers of second conductivity type formed on both sides of the third optical guiding layer on the second optical guiding layer, wherein relations represented by $Z>Y3>Y2>X\geq0$ and $Y1>Y2$ are provided between respective AlAs mole fractions of the $Ga_{1-X}Al_XAs$ layer, $Ga_{1-Y1}Al_{Y1}As$ layer, $Ga_{1-Y2}Al_{Y2}As$ layer, $Ga_{1-Y3}Al_{Y3}As$ layer, and $Ga_{1-Z}Al_ZAs$ layer.

Since the relations represented by $Z>Y3>Y2>X\geq0$ and $Y1>Y2$ are provided between the foregoing AlAs mole fractions, the difference between the effective refractive indices inside and outside the stripe region can have a large value on the order of $6\times10^{-3}$ or more, while the current blocking layer becomes transparent to the lasing light generated in the active layer.

Consequently, the second semiconductor laser device can perform stable oscillation in a stable fundamental transverse mode in both low-power and high-power operations, while the near field pattern is prevented from spreading out into the current blocking layer, so that a smaller astigmatic distance is achieved by reducing the wavefront aberration of the propagated lasing light. Moreover, since a saturable absorbing region is formed in the direction of a resonator in the stripe region, self-sustained pulsation can easily be induced even when a large difference exists between the effective refractive indices inside and outside the stripe region.

Thus, according to the second semiconductor laser device, a low-noise characteristics, steady operation in a fundamental transverse mode in high-power operation, and a low operating current with no astigmatic distance are implemented. Since an optical part for compensating for an astigmatic distance becomes unnecessary, an optical pickup can be miniaturized at lower cost.

Third to ninth semiconductor laser devices of the present invention have been implemented based on the findings that self-sustained pulsation occurs when the thickness of the loss varying layer is 5 nm or more and that light output can be controlled easily in low-power operation and a current-versus-light-output characteristics with excellent linearity are obtained when the thickness of the loss varying layer has a thickness obtained by adding 5 nm to one fifth of the thickness of the active layer.

Specifically, the third semiconductor laser device comprises: an active layer composed of a $Ga_{1-X}Al_XAs$ layer; a first optical guiding layer composed of a $Ga_{1-Y1}Al_{Y1}As$ layer of first conductivity type including at least one loss varying layer composed of a GaAlAs layer having a bandgap equal to or less than a bandgap of the active layer; a second optical guiding layer composed of a $Ga_{1-Y2}Al_{Y2}As$ layer of first conductivity type formed on the first optical guiding layer; a third optical guiding layer composed of a $Ga_{1-Y3}Al_{Y3}As$ layer of first conductivity type formed in a stripe on the second optical guiding layer; and current blocking layers composed of $Ga_{1-Z}Al_ZAs$ layers of second conductivity type formed on both sides of the third optical guiding layer on the second optical guiding layer, wherein relations represented by $Z>Y3>Y2>X\geq0$ and $Y1>Y2$ are provided between respective AlAs mole fractions of the $Ga_{1-X}Al_XAs$ layer, $Ga_{1-Y1}Al_{Y1}As$ layer, $Ga_{1-Y2}Al_{Y2}As$ layer, $Ga_{1-Y3}Al_{Y3}As$ layer, and $Ga_{1-Z}Al_ZAs$ layer.

Since the thickness of the loss varying layer is 5 nm or more in the third semiconductor laser device, the saturable absorbing effect is surely achieved by the loss varying layer, resulting in self-sustained pulsation. Consequently, a multimode oscillation spectrum is produced to provide a low-noise characteristics. Moreover, since the thickness of the loss varying layer is equal to or less than a thickness obtained by adding 5 nm to one fifth of the thickness of the active layer, the optical confinement factor in confining the optical field distribution vertically in the active layer becomes sufficiently larger than the optical confinement factor in confining the optical field distribution vertically in the loss varying layer, so that a current-versus-light-output characteristic with excellent linearity is provided. Hence, there can be implemented a high-power, low-noise semiconductor laser device producing a high light output even in low-power operation which can be controlled easily.

In the third semiconductor laser device, the total thickness of the second optical guiding layer and the loss varying layer is preferably 0.15 μm or less. With the arrangement, a stable real refractive-index waveguide mechanism is ensured and the optical field distribution can be confined transversely in the current channel more tightly, so that the guided beam undergoes a reduced light absorption loss in the current blocking layer and in the region of the active layer underlying the current blocking layer. Consequently, the degree of bent of the wavefront of the guided beam is lessened, resulting in a reduced astigmatic distance.

Specifically, the fourth semiconductor laser device comprises: a first optical guiding layer composed of a semiconductor layer of first conductivity type formed on a semiconductor substrate; an active layer composed of a semiconductor layer formed on the first optical guiding layer; a second optical guiding layer composed of a semiconductor layer of second conductivity type formed on the active layer; a stripe region composed of a semiconductor layer of second conductivity type formed on the central portion of the second optical guiding layer; current blocking layers composed of semiconductor layers of first conductivity type formed on both sides of the stripe region on the second optical guiding layer and having a refractive index lower than a refractive index of the first optical guiding layer; and a third optical guiding layer composed of a semiconductor layer of second conductivity type formed over the stripe region and the current blocking layers, wherein the first optical guiding layer has at least one loss varying layer absorbing the lasing light from the active layer and the thickness of the loss varying layer ranges between 5 nm and a thickness obtained by adding 5 nm to one fifth of the thickness of the active layer.

In the fourth semiconductor laser device, the thickness of the loss varying layer is 5 nm or more, so that the saturable absorption effect is surely achieved by the loss varying layer, resulting in self-sustained pulsation. Moreover, since the thickness of the loss varying layer is equal to or less than a thickness obtained by adding 5 nm to one fifth of the thickness of the active layer, the optical confinement factor in confining the optical field distribution vertically in the active layer becomes sufficiently larger than the optical confinement factor in confining the optical field distribution vertically in the loss varying layer, so that current-versus-light-output characteristics with excellent linearity are provided. Hence, there can be implemented a high-power, low-noise semiconductor laser device producing a high light output even in low-power operation which can be controlled easily.

In the fourth semiconductor laser device, the thickness of the second optical guiding layer is preferably 0.15 µm or less. With the arrangement, a stable real refractive-index mechanism is ensured and the optical field distribution can be confined transversely in the current channel more tightly, so that the guided beam undergoes a small light absorption loss in the region of the active layer underlying the current blocking layer. Consequently, the degree of bent of the wavefront of the guided beam can be lessened, resulting in a small astigmatic distance.

Specifically, the fifth semiconductor laser device comprises: a first optical guiding layer composed of a semiconductor layer of first conductivity type formed on a semiconductor substrate; an active layer composed of a semiconductor layer formed on the first optical guiding layer; a second optical guiding layer composed of a semiconductor layer of second conductivity type formed on the active layer; a third optical guiding layer composed of a semiconductor layer of second conductivity type formed on the second optical guiding layer, the third optical guiding layer becoming transparent to the lasing light from the active layer; a stripe region composed of a semiconductor layer of second conductivity type formed on the central portion of the third optical guiding layer; current blocking layers composed of semiconductor layers of first conductivity type formed on both sides of the stripe region on the third optical guiding layer and having a refractive index lower than a refractive index of the first optical guiding layer; and a fourth optical guiding layer composed of a semiconductor layer of second conductivity type formed over the stripe region and the current blocking layers, wherein the first optical guiding layer has at least one loss varying layer absorbing the lasing light from the active layer and the thickness of the loss varying layer ranges between 5 nm and a thickness obtained by adding 5 nm to one fifth of the thickness of the active layer.

In the fifth semiconductor laser device, the thickness of the loss varying layer is 5 nm or more, so that the saturable absorption effect is surely achieved by the loss varying layer, resulting in self-sustained pulsation. Moreover, since the thickness of the loss varying layer is equal to or less than a thickness obtained by adding 5 nm to one fifth of the thickness of the active layer, the optical confinement factor in confining the optical field distribution vertically in the active layer becomes sufficiently larger than the optical confinement factor in confining the optical field distribution vertically in the loss varying layer, so that current-versus-light-output characteristics with excellent linearity are provided. Hence, there can be implemented a high-power, low-noise semiconductor laser device producing a high light output even in low-power operation which can be controlled easily.

In the fifth semiconductor laser device, the total thickness of the second optical guiding layer and the third optical guiding layer is preferably 0.15 µm or less. With the arrangement, a stable real refractive-index mechanism is ensured and the optical field distribution can be confined transversely in the current channel more tightly, so that the guided beam undergoes a small light absorption loss in the current blocking layer and in the region of the active layer underlying the current blocking layer. Consequently, the degree of bent of the wavefront of the guided beam can be lessened, resulting in a small astigmatic distance.

Specifically, the sixth semiconductor laser device comprises: a first optical guiding layer composed of a semiconductor layer of first conductivity type formed on a semiconductor substrate; an active layer composed of a semiconductor layer formed on the first optical guiding layer; a second optical guiding layer composed of a semiconductor layer of second conductivity type formed on the active layer; a stripe region composed of a semiconductor layer of second conductivity type formed on the central portion of the second optical guiding layer; current blocking layers composed of semiconductor layers of first conductivity type formed on both sides of the stripe region on the second optical guiding layer and having a refractive index lower than a refractive index of the first optical guiding layer; and a third optical guiding layer composed of a semiconductor layer of second conductivity type formed over the stripe region and the current blocking layers, wherein the second optical guiding layer has at least one loss varying layer absorbing the lasing light from the active layer and the thickness of the loss varying layer ranges between 5 nm and a thickness obtained by adding 5 nm to one fifth of the thickness of the active layer.

In the sixth semiconductor laser device, the thickness of the loss varying layer is 5 nm or more, so that the saturable absorption effect is surely achieved by the loss varying layer, resulting in self-sustained pulsation. Moreover, since the thickness of the loss varying layer is equal to or less than a thickness obtained by adding 5 nm to one fifth of the thickness of the active layer, the optical confinement factor in confining the optical field distribution vertically in the active layer becomes sufficiently larger than the optical confinement factor in confining the optical field distribution vertically in the loss varying layer, so that current-versus-light-output characteristics with excellent linearity are provided. Hence, there can be implemented a high-power, low-noise semiconductor laser device producing a high light output even in low-power operation which can be controlled easily.

In the sixth laser semiconductor laser device, the thickness of the second optical guiding layer including the loss varying layer is preferably 0.15 µm or less. With the arrangement, a stable real refractive-index mechanism is ensured and the optical field distribution can be confined transversely in the current channel more tightly, so that the guided beam undergoes a small light absorption loss in the current blocking layer and in the region of the active layer underlying the current blocking layer. Consequently, the degree of bent of the wavefront of the guided beam can be lessened, resulting in a small astigmatic distance.

Specifically, the seventh semiconductor laser device comprises: a first optical guiding layer composed of a semiconductor layer of first conductivity type formed on a semiconductor substrate; an active layer composed of a semiconductor layer formed on the first optical guiding layer; a second optical guiding layer composed of a semiconductor layer of second conductivity type formed on the active layer; a third optical guiding layer composed of a semiconductor layer of second conductivity type formed on the second optical guiding layer, the third optical guiding layer becoming transparent to the lasing light from the active layer; a stripe region composed of a semiconductor layer of second conductivity type formed on the central portion of the third optical guiding layer; current blocking layers composed of semiconductor layers of first conductivity type formed on both sides of the stripe region on the third optical guiding layer and having a refractive index lower than a refractive index of the first optical guiding layer; and another third optical guiding layer composed of a semiconductor layer of second conductivity type formed over the stripe region and the current blocking layers, wherein the second optical guiding layer has at least one loss varying layer absorbing the lasing light from the active layer and the thickness of the loss varying layer ranges between 5 nm and a thickness obtained by adding 5 nm to one fifth of the thickness of the active layer.

In the seventh semiconductor laser device, the thickness of the loss varying layer is 5 nm or more, so that the saturable absorption effect is surely achieved by the loss varying layer, resulting in self-sustained pulsation. Moreover, since the thickness of the loss varying layer is equal to or less than a thickness obtained by adding 5 nm to one fifth of the thickness of the active layer, the optical confinement factor in confining the optical field distribution vertically in the active layer becomes sufficiently larger than the optical confinement factor in confining the optical field distribution vertically in the loss varying layer, so that current-versus-light-output characteristics with excellent linearity are provided. Hence, there can be implemented a high-power, low-noise semiconductor laser device producing a high light output even in low-power operation which can be controlled easily.

In the seventh semiconductor laser device, the total thickness of the second optical guiding layer including the loss varying layer and the third optical guiding layer is preferably 0.15 μm or less. With the arrangement, a stable real refractive-index mechanism is ensured and the optical field distribution can be confined transversely in the current channel more tightly, so that the guided beam undergoes a small light absorption loss in the current blocking layer and in the region of the active layer underlying the current blocking layer. Consequently, the degree of bent of the wavefront of the guided beam can be lessened, resulting in a small astigmatic distance.

Specifically, the eighth semiconductor laser device comprises: a first optical guiding layer composed of a semiconductor layer of first conductivity type formed on a semiconductor substrate; an active layer composed of a semiconductor layer formed on the first optical guiding layer; a second optical guiding layer composed of a semiconductor layer of second conductivity type formed on the active layer; a stripe region composed of a semiconductor layer of second conductivity type formed on the central portion of the second optical guiding layer; current blocking layers composed of semiconductor layers of first conductivity type formed on both sides of the stripe region on the second optical guiding layer and having a refractive index lower than a refractive index of the first optical guiding layer; and a third optical guiding layer composed of a semiconductor layer of second conductivity type formed over the stripe region and the current blocking layers, wherein the third optical guiding layer has at least one loss varying layer absorbing the lasing light from the active layer and the thickness of the loss varying layer ranges between 5 nm and a thickness obtained by adding 5 nm to one fifth of the thickness of the active layer.

In the eighth semiconductor laser device, the thickness of the loss varying layer is 5 nm or more, so that the saturable absorption effect is surely achieved by the loss varying layer, resulting in self-sustained pulsation. Moreover, since the thickness of the loss varying layer is equal to or less than a thickness obtained by adding 5 nm to one fifth of the thickness of the active layer, the optical confinement factor in confining the optical field distribution vertically in the active layer becomes sufficiently larger than the optical confinement factor in confining the optical field distribution vertically in the loss varying layer, so that current-versus-light-output characteristics with excellent linearity are provided. Hence, there can be implemented a high-power, low-noise semiconductor laser device producing a high light output even in low-power operation which can be controlled easily.

In the eighth semiconductor laser device, the thickness of the second optical guiding layer is preferably 0.15 μm or less. With the arrangement, a stable real refractive-index mechanism is ensured and the optical field distribution can be confined transversely in the current channel more tightly, so that the guided beam undergoes a small light absorption loss in the current blocking layer and in the region of the active layer underlying the current blocking layer. Consequently, the degree of bent of the wavefront of the guided beam can be lessened, resulting in a small astigmatic distance.

Specifically, the ninth semiconductor laser device comprises: a first optical guiding layer composed of a semiconductor layer of first conductivity type formed on a semiconductor substrate; an active layer composed of a semiconductor layer formed on the first optical guiding layer; a second optical guiding layer composed of a semiconductor layer of second conductivity type formed on the active layer; a third optical guiding layer composed of a semiconductor layer of second conductivity type formed on the second optical guiding layer, the third optical guiding layer becoming transparent to the lasing light the active layer; a stripe region composed of a semiconductor layer of second conductivity type formed on the central portion of the third optical guiding layer; current blocking layers composed of semiconductor layers of first conductivity type formed on both sides of the stripe region on the third optical guiding layer and having a refractive index lower than a refractive index of the first optical guiding layer; and a fourth optical guiding layer composed of a semiconductor layer of second conductivity type formed over the stripe region and the current blocking layers, wherein the fourth optical guiding layer has at least one loss varying layer absorbing the oscillated lasing light from the active layer and the thickness of the loss varying layer ranges between 5 nm and a thickness obtained by adding 5 nm to one fifth of the thickness of the active layer.

In the ninth semiconductor laser device, the thickness of the loss varying layer is 5 nm or more, so that the saturable absorption effect is surely achieved by the loss varying layer, resulting in self-sustained pulsation. Moreover, since the thickness of the loss varying layer is equal to or less than a thickness obtained by adding 5 nm to one fifth of the thickness of the active layer, the optical confinement factor in confining the optical field distribution vertically in the active layer becomes sufficiently larger than the optical confinement factor in confining the optical field distribution vertically in the loss varying layer, so that current-versus-light-output characteristics with excellent linearity are provided. Hence, there can be implemented a high-power, low-noise semiconductor laser device producing a high light output even in low-power operation which can be controlled easily.

In the ninth semiconductor laser device, the total thickness of the second optical guiding layer and the third optical guiding layer is preferably 0.15 μm or less. With the arrangement, a stable real refractive-index mechanism is ensured and the optical field distribution can be confined transversely in the current channel more tightly, so that the guided beam undergoes a small light absorption loss in the current blocking layer and in the region of the active layer underlying the current blocking layer. Consequently, the degree of bent of the wavefront of the guided beam can be lessened, resulting in a small astigmatic distance.

In the third to ninth semiconductor laser devices, the loss varying layer preferably has a quantum well structure. With the arrangement, even the loss varying layer with a small thickness can achieve an enhanced saturable absorption effect.

In the third to ninth semiconductor laser devices, the active layer preferably has a multiple-quantum-well structure. With the arrangement, even when the active layer has a small thickness, the threshold current for lasing oscillation can be reduced.

In the third to ninth semiconductor laser devices, the loss varying layer preferably has a quantum well structure and the active layer has a multiple-quantum-well structure. With the arrangement, even the loss varying layer with a small thickness can achieve an enhanced saturable absorption effect, while the threshold current for lasing oscillation can be reduced even when the active layer has a small thickness. Moreover, since the loss varying layer swiftly becomes transparent to the lasing light, self-sustained pulsation readily occurs, while current-versus-light-output characteristics with excellent linearity can be provided even with a small threshold current for lasing oscillation.

DETAILED DESCRIPTION OF THE INVENTION

Figure 1:
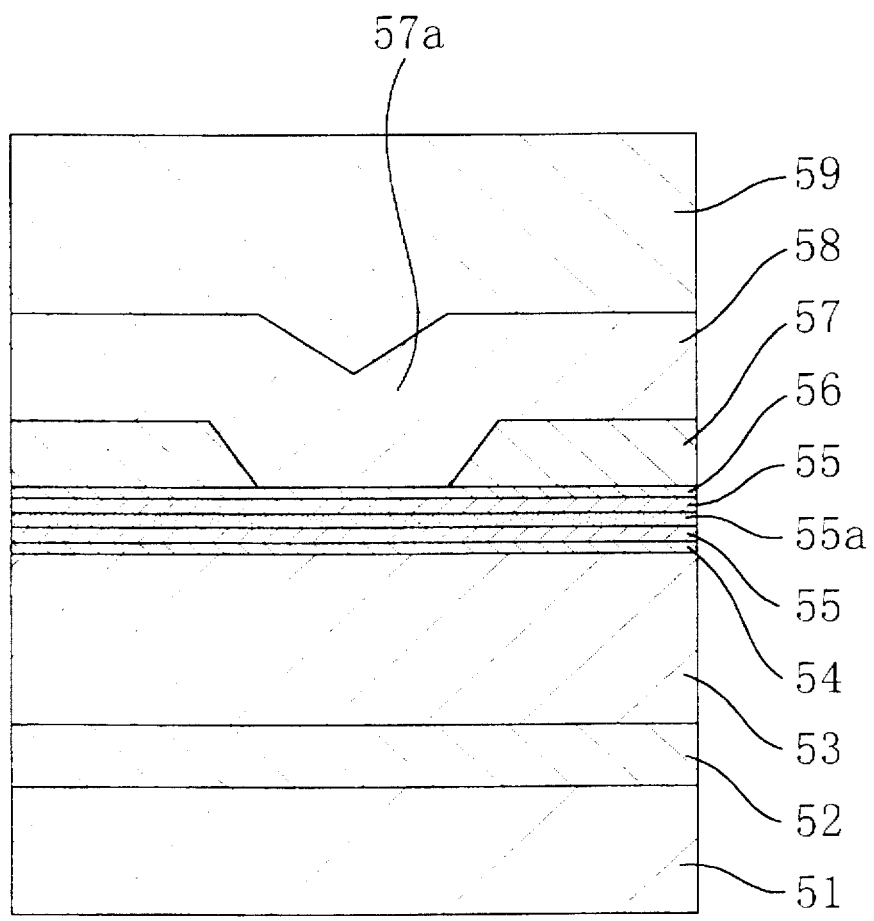
FIG. 1 is a cross-sectional view of a semiconductor laser device according to a first embodiment.

Referring now to the drawings, semiconductor laser devices according to the individual embodiments of the present invention will be described.

(First Embodiment)

FIG. 1 is a cross-sectional view of a semiconductor laser device according to a first embodiment.

As shown in the drawing, a buffer layer 52 composed of n-type GaAs, a cladding layer 53 composed of n-type $Ga_{0.5}Al_{0.5}As$, and an active layer 54 (with bandgap energy of 1.611 eV) composed of $Ga_{0.85}Al_{0.15}As$ are formed sequentially on a semiconductor substrate 51 composed of n-type GaAs. On the active layer 54, there are formed a first optical guiding layer 55 composed of p-type $Ga_{0.5}Al_{0.5}As$ and including a loss varying layer 55a (with bandgap energy of 1.5989 eV) composed of p-type $Ga_{0.86}Al_{0.14}As$ and having a bandgap smaller than that of the active layer 54 and a second optical guiding layer 56 composed of p-type $Ga_{0.8}Al_{0.2}As$ in this order. To confine an injected current, current blocking layers 57 are formed on the entire area of the second optical guiding layer 56 except for a portion corresponding to a stripe region 57a. Over the stripe region 57a and the current blocking layers 57, there is formed a third optical guiding layer 58 composed of p-type $Ga_{0.5}Al_{0.5}As$, on which is formed a contact layer 59 composed of a p-type GaAs.

The first embodiment is characterized in that the AlAs mole fraction of the current blocking layer 57 is higher than the AlAs mole fraction of the third optical guiding layer 58 composed of p-type $Ga_{0.5}Al_{0.5}As$. If the AlAs mole fraction of the current blocking layer 57 is the same as the AlAs mole fraction of the third optical guiding layer 59, a refractive index decreases due to a plasma effect in the stripe region 57a, forming an antiguiding waveguide, so that oscillation in fundamental transverse mode does not occur. If the AlAs mole fraction of the current blocking layer 57 is lower than the AlAs mole fraction of the third optical guiding layer 59 composed of p-type $Ga_{0.5}Al_{0.5}As$, oscillation in fundamental transverse mode inevitably becomes unstable.

To ensure stable oscillation in fundamental transverse mode, the AlAs mole fraction of the current blocking layer 57 in the first embodiment is 0.65, which is higher by 0.15 than the AlAs mole fraction of the third optical guiding layer 58 composed of p-type $Ga_{0.5}Al_{0.5}As$. The arrangement produces a difference in effective refractive index, which achieves a real refractive-index waveguide mechanism. Consequently, not only stable oscillation in fundamental transverse mode but also a small astigmatic distance is attained by suppressing the spreading out of optical field into the current blocking layer 57.

In the structure, the current injected through the contact layer 59 composed of p-type GaAs is confined in the stripe region 57a so that laser oscillation at a wavelength of about 780 nm occurs in the active layer 54 composed of $Ga_{0.85}Al_{0.15}As$ and underlying the stripe region 57a. In the present embodiment, the AlAs mole fraction of the first optical guiding layer 55 composed of p-type $Ga_{0.5}Al_{0.5}As$ is sufficiently higher than the AlAs mole fraction of the active layer 54 so that carriers are effectively confined in the active layer 54 to enable oscillation at a wavelength of about 780 nm. Specifically, the AlAs mole fraction of 0.45 or higher is required in order to cause laser oscillation at a wavelength of about 780 nm. In the first embodiment, the AlAs mole fraction is 0.5.

Moreover, the first embodiment is free from the problem of surface oxidation since regrowth is carried out on the second optical guiding layer 56 composed of p-type $Ga_{0.8}Al_{0.2}As$ having a low AlAs mole fraction. Preferably, the AlAs mole fraction of the second optical guiding layer 6 is 0.15 or less with which regrowth is carried out easily and the second optical guiding layer 56 becomes transparent at an oscillation wavelength of the laser. Specifically, the AlAs mole fraction of the second optical guiding layer 56 is 0.2 in the first embodiment.

The thickness of the second optical guiding layer 56 is preferably 0.5 µm or less, which barely influences the optical field distribution. In the first embodiment, the thickness of the second optical guiding layer 56 is 0.03 µm. Thus, the first embodiment achieves oscillation at a wavelength of about 780 nm by separately forming a layer for confining carriers (first optical guiding layer 55) and a layer on which regrowth is carried out (second optical guiding layer 56).

Since the bandgap of the current blocking layer 57 composed of n-type $Ga_{0.35}Al_{0.65}As$ is larger than the bandgap of the active layer 54 composed of $Ga_{0.85}Al_{0.15}As$, no light absorption is performed by the current blocking layer 57, resulting in a semiconductor laser device with a small waveguide loss and a low operating current.

In the structure, it is necessary to reduce the thickness of the active layer 4 to 40 nm or less in order to prevent COD (Catastrophic Optical Damage), which is the destruction of a laser end face by its own light in high-power operation. In the present embodiment the thickness of the active layer 54 is 35 nm.

In the case of causing self-sustained pulsation by producing a multimode spectrum to provide low noise characteristics in the conventional structure, it is necessary to change the region of the active layer 54 underlying the current blocking layer 57 into a saturable absorbing region by horizontally expanding the optical field distribution, so that the difference between the effective refractive indices inside and outside the stripe region 57a is about $3 \times 10^{-3}$. As a result, not only the transverse mode is deformed but also the loss in the active layer 54 is increased significantly in high-power operation, which disadvantageously causes an increase in operating current.

To prevent the disadvantage in the first embodiment, the lasing light generated in the active layer 54 is absorbed by the loss varying layer 55a (with bandgap energy of 1.5989 eV) composed of p-type $Ga_{0.86}Al_{0.14}As$ having a bandgap smaller than the bandgap of the active layer 54 (with bandgap energy of 1.611 eV) composed of $Ga_{0.85}Al_{0.15}As$. However, since the absorption by the loss varying layer 55a composed of GaAlAs is saturated, the loss varying layer 55a functions as a saturable absorbing region, so that it becomes possible to form the saturable absorbing region in the direction of a resonator in the stripe region 57a other than the active layer 54. Therefore, self-sustained pulsation is easily achieved in a semiconductor laser device having the real refractive-index waveguide mechanism provided with the active layer 54 having a reduced thickness and a difference of $6 \times 10^{-3}$ or more in effective refractive index.

It will be appreciated that stable oscillation in fundamental transverse mode is performed, since the loss in the active layer 54 accompanying the self-sustained pulsation does not occur and hence the increase in operating current is suppressed.

To cause the loss varying layer 55a composed of GaAlAs to effectively function as the saturable absorbing region, the thickness and AlAs composition of the loss varying layer 55a and the distance between the loss varying layer 55a and the active layer 54 serve as important structural parameters.

If the thickness of the loss varying layer 55a is excessively large, the loss varying layer 55a functions as a mere absorption region since the absorption is not saturated, so that not only the self-sustained pulsation is not achieved but also a threshold current is increased and slope efficiency is reduced, resulting in the loss of linearity in the current-versus-light-output characteristics. Hence, it is necessary to reduce the thickness of the loss varying layer 55a composed of GaAlAs to 0.02 µm or less.

In general, a typical semiconductor laser device which requires high-power operation uses dielectric films or the like on laser facets to implement asymmetrical coating whereby the front facet has a low reflectance and the rear facet has a high refractive index, so that light density in the resonator is reduced in low-power operation. Accordingly, the thickness of the loss varying layer 55 is reduced to provide a quantum effect so that the loss varying layer 55a functions as a saturable absorbing region. With the arrangement, the number of energy levels is reduced so that saturable absorption is easily caused. Although the thickness of the loss varying layer 55a is 0.01 µm to exert the quantum effect in the first embodiment, if the loss varying layer 55a is thinned to have a thickness smaller than 0.01 µm, the number of energy levels is further reduced and saturable absorption is more likely to occur, so that the loss varying layer 55a is formed to have a multiple-quantum-well structure consisting of two or more layers to control the frequency of self-sustained pulsation.

If the distance between the active layer 54 and the loss varying layer 55a is excessively small, the loss varying layer 55a is greatly influenced by the overflow of carriers from the active layer 54, so that the loss varying layer 55a composed of GaAlAs no more functions as an absorption region. Conversely, if the distance between the active layer 54 and the loss varying layer 55a is excessively large, the optical field intensity is reduced so that the absorption by the loss varying layer 55a composed of GaAlAs is not saturated. In view of the foregoing, the distance between the active layer 54 and the loss varying layer 55a is 0.05 μm in the first embodiment.

To exert the saturable absorption effect by absorbing a lasing light oscillated in the active layer 54, the AlAs composition of the loss varying layer 55a composed of GaAlAs should be determined such that the bandgap of the loss varying layer 55a becomes equal to or smaller than that of the active layer 54. In the first embodiment, the AlAs composition of the loss varying layer 55a composed of GaAlAs is 0.14. In the case where the loss varying layer 55a composed of GaAlAs has a quantum effect, it is sufficient to determine the AlAs composition such that the loss varying layer 55a has a bandgap equal to or less than an energy level contributing to an oscillation wavelength.

Figure 2:
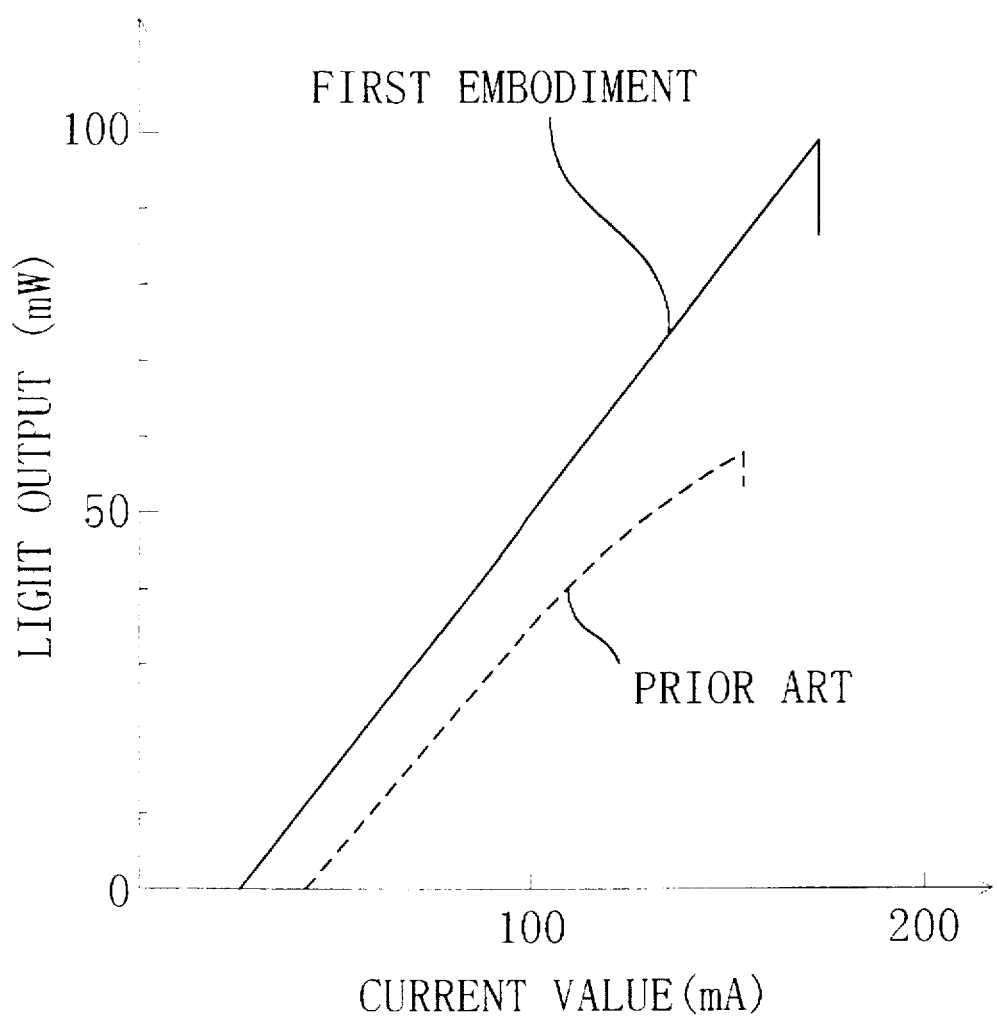
FIG. 2 shows current-versus-light-output characteristics of the semiconductor laser device according to the first embodiment.

FIG. 2 shows the current-versus-light-output characteristics of the semiconductor laser device according to the first embodiment. In the semiconductor laser having a resonator with a length of 400 μm, a maximum light output of 100 mW is obtained. The operating current required to provide a light output of 35 mW at room temperature is 75 mA.

In a low-noise laser device of conventional structure, a saturable absorbing region is formed in the active layer 54 underlying the current blocking layer 57 outside the stripe region 57a, so that a loss in the active layer 54 is increased, which causes an increase in operating current. By contrast, since the first embodiment has provided the saturable absorbing region outside the active layer 54, a loss increase in the active layer 54 is suppressed so that driving with a small operating current is implemented.

According to the first embodiment, a spectrum obtained when the light output is 3 mW has a self-sustained pulsation characteristic at a wavelength of about 780 nm and has achieved a relative intensity noise of −135 dB/Hz at a feedback ratio of 0% to 10%, so that low-noise characteristics sufficient for application in an optical disk are obtained.

Figure 3:
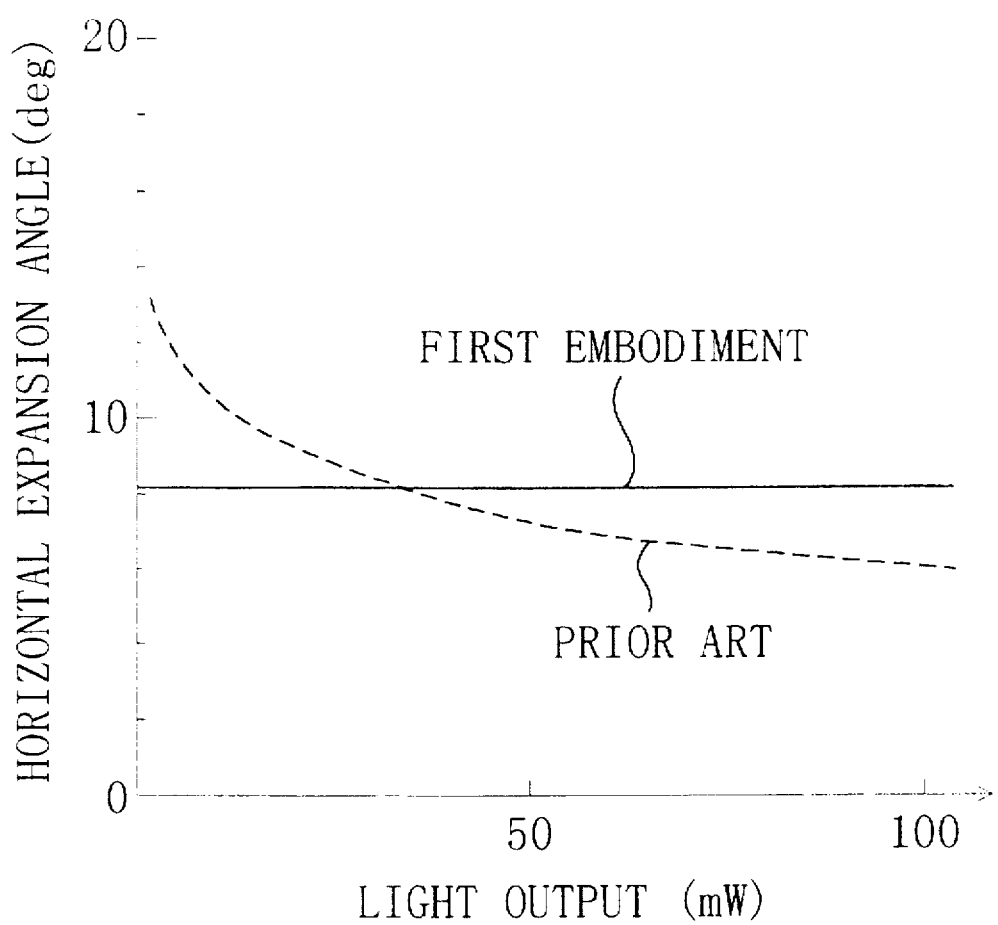
FIG. 3 shows the dependence of a horizontal expansion angle on a light output in the semiconductor laser device according to the first embodiment.

FIG. 3 shows the dependence of a beam divergence angle parallel to the junction plane of the semiconductor laser device according to the first embodiment on a light output. To achieve self-sustained pulsation in the conventional low-noise laser device, it is necessary to expand the optical field distribution to the outside of the stripe region and form a large saturable absorbing region underneath the current blocking layer, so that a difference between effective refractive indices inside and outside the stripe region should be reduced to about $3 \times 10^{-3}$. As a result, the refractive index in the stripe decreases due to a plasma effect when a current is injected, resulting in a change in optical field distribution, which significantly changes the beam divergence angle parallel to the junction plane with an increase in light output. However, since the first embodiment forms a saturable absorbing region outside the active layer to achieve the self-sustained pulsation, it does not undergo an influence of the reduced refractive index accompanying the plasma effect, so that the self-sustained pulsation is achieved easily even when a difference in effective refractive index is $6 \times 10^{-3}$ or more required to provide a stable optical field distribution. Consequently, stable oscillation in a fundamental transverse mode is achieved without depending on variations in light output.

Figure 4:
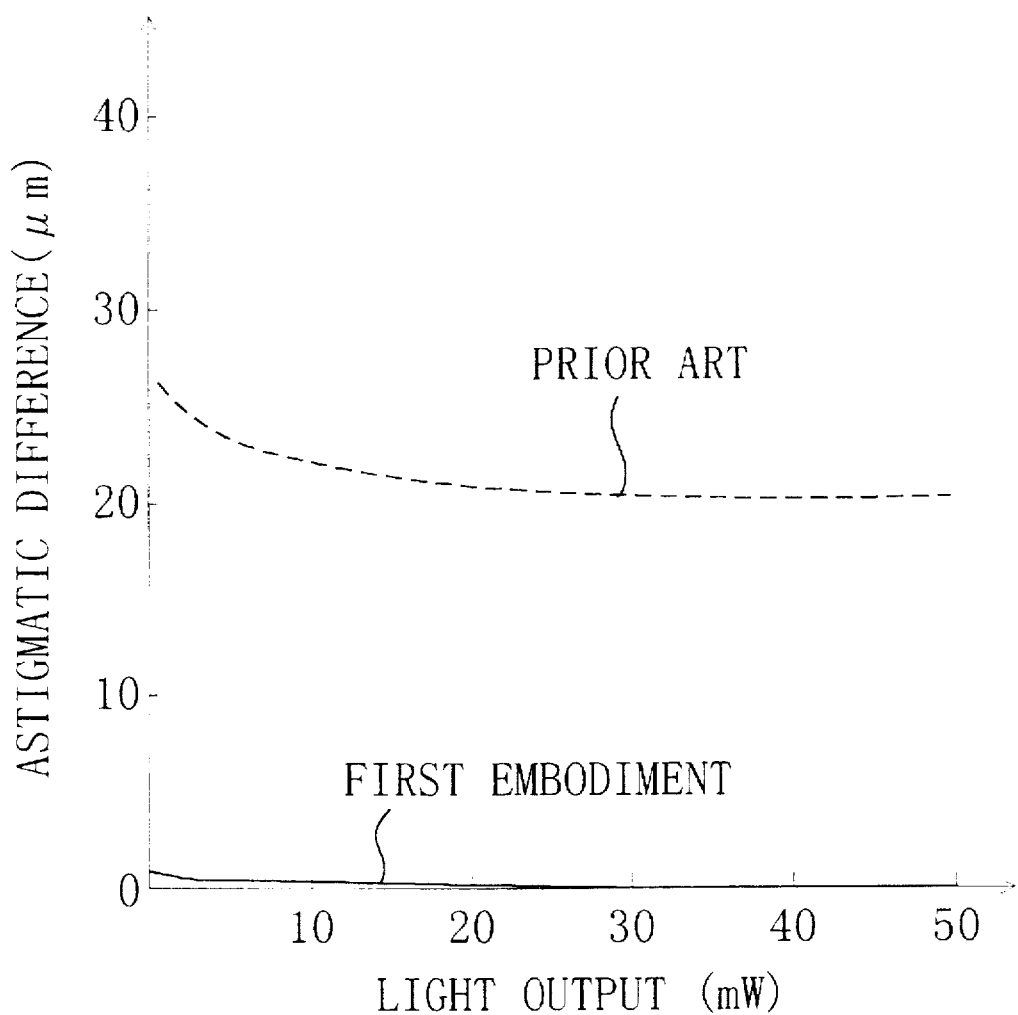
FIG. 4 shows the dependence of an astigmatic distance on the light output in the semiconductor laser device according to the first embodiment.

FIG. 4 shows the dependence of the astigmatic distance on the light output in the semiconductor laser device according to the first embodiment. Since the saturable absorbing region is formed underneath the current blocking layer in the conventional low-noise laser device, a loss occurs in the active layer underlying the current blocking layer so that the phase of a lasing light guided below the current blocking layer is delayed from the lasing light guided through the stripe region. Consequently, the wavefront of the lasing light is bent and the astigmatic distance becomes as large as 20 μm, while the astigmatic distance varies with variations in light output due to a significant change in the loss in the active layer underlying the current blocking layer when a current is injected. However, since the first embodiment has formed the saturable absorbing region for achieving self-sustained pulsation in the stripe region so that the optical field is tightly confined in the stripe region by the real refractive-index waveguide mechanism and the spreading out of the optical field into a region underlying the current blocking layer is suppressed, the dependence of the astigmatic distance on the light output can be eliminated and an astigmatic distance of 1 μm or less is constantly provided.

The use of the high-power semiconductor laser device with a reduced astigmatic distance and low noise according to the first embodiment as a light source of an optical disk eliminates the necessity for a circuit with an rf modulated current superimposed thereon or a lens for compensating for an astigmatic distance, so that an optical pickup can greatly be miniaturized at lower cost.

(Second Embodiment)

Figure 5:
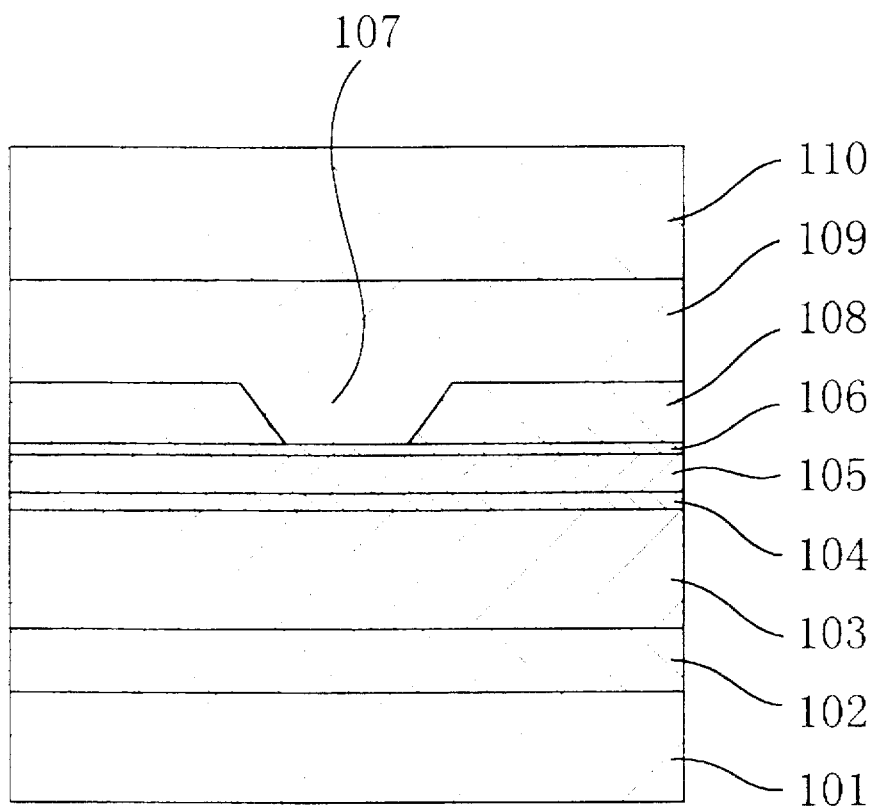
FIG. 5 is a cross-sectional view of a semiconductor laser device according to a second embodiment.

FIG. 5 shows a cross-sectional structure of a semiconductor laser device according to a second embodiment. As shown in the drawing, a buffer layer 102 composed of n-type GaAs and having a thickness of 0.5 μm, a first optical guiding layer 103 composed of n-type $Ga_{0.5}Al_{0.5}As$ and having a thickness of 2.0 μm, an active layer 104 composed of $Ga_{0.85}Al_{0.5}As$ and having a thickness of 0.06 μm, a second optical guiding layer 105 composed of p-type $Ga_{0.5}Al_{0.5}As$ and having a thickness of 0.1 μm, and a loss varying layer 106 composed of p-type $Ga_{0.86}Al_{0.14}As$ are formed sequentially on a semiconductor substrate 101 composed of n-type GaAs. On the central portion of the loss varying layer 106, there is formed a stripe region 107 composed of p-type $Ga_{0.5}Al_{0.5}As$ and having a width of 2.5 μm for forming a current channel, while current blocking layers 108 each composed of n-type $Ga_{0.35}Al_{0.65}As$ and having a thickness of 1.0 μm are formed on both sides of the stripe region 107 on the loss varying layer 106. Over the stripe region 107 and the current blocking layers 108, a third optical guiding layer 109 composed of p-type $Ga_{0.5}Al_{0.5}As$ and having a thickness of 2.0 μm is formed integrally with the stripe region 107, on which is formed a contact layer 110 composed of p-type GaAs and having a thickness of 2.0 μm.

In order to achieve stable fundamental transverse mode operation, the current blocking layers 108 are composed of $Ga_{0.35}Al_{0.65}As$ having a refractive index lower than that of the first optical guiding layer 103 and transparent to the lasing light. Since the refractive index of the current blocking layer 108 is lower than the refractive indices of the first to third optical guiding layers 103, 105, and 109, the peak of the optical field intensity distribution under the current blocking layer 108 is observed at the side of the first optical guiding layer 103, i.e., at the side of the semiconductor substrate 101, so that the effective refractive index of the optical field distribution underneath the current blocking layer 108 is reduced. As a result, the effective refractive index of the optical field distribution below the stripe region 107 becomes higher than the effective refractive index of the optical field distribution below the current blocking layer 108, so that the real refractive-index waveguide mechanism is obtained whereby the optical field distribution is stably confined in the current channel.

A description will be given below to the thickness of the loss varying layer 106 required by the semiconductor laser device to perform self-sustained pulsation.

If the thickness of the loss varying layer 106 is excessively small, the saturable absorption effect exerted by the loss varying layer 106 is reduced so that self-sustained pulsation does not occur. To cause self-sustained pulsation without greatly increasing the value of operating current and obtain a symmetrical far-field pattern in the vertical direction, the loss varying layer 106 should have a thickness of 5 nm or more. Hence, the second embodiment uses the loss varying layer 106 having a thickness of 10 nm.

Below, a description will be given to relations between the oscillation spectrum characteristics and the difference $\Delta\lambda$ in bandgap wavelength (obtained by subtracting the bandgap wavelength of the active layer 104 from the bandgap wavelength of the loss varying layer 106) and between the oscillation spectrum characteristic and the thickness of the loss varying layer 106.

Figure 6:
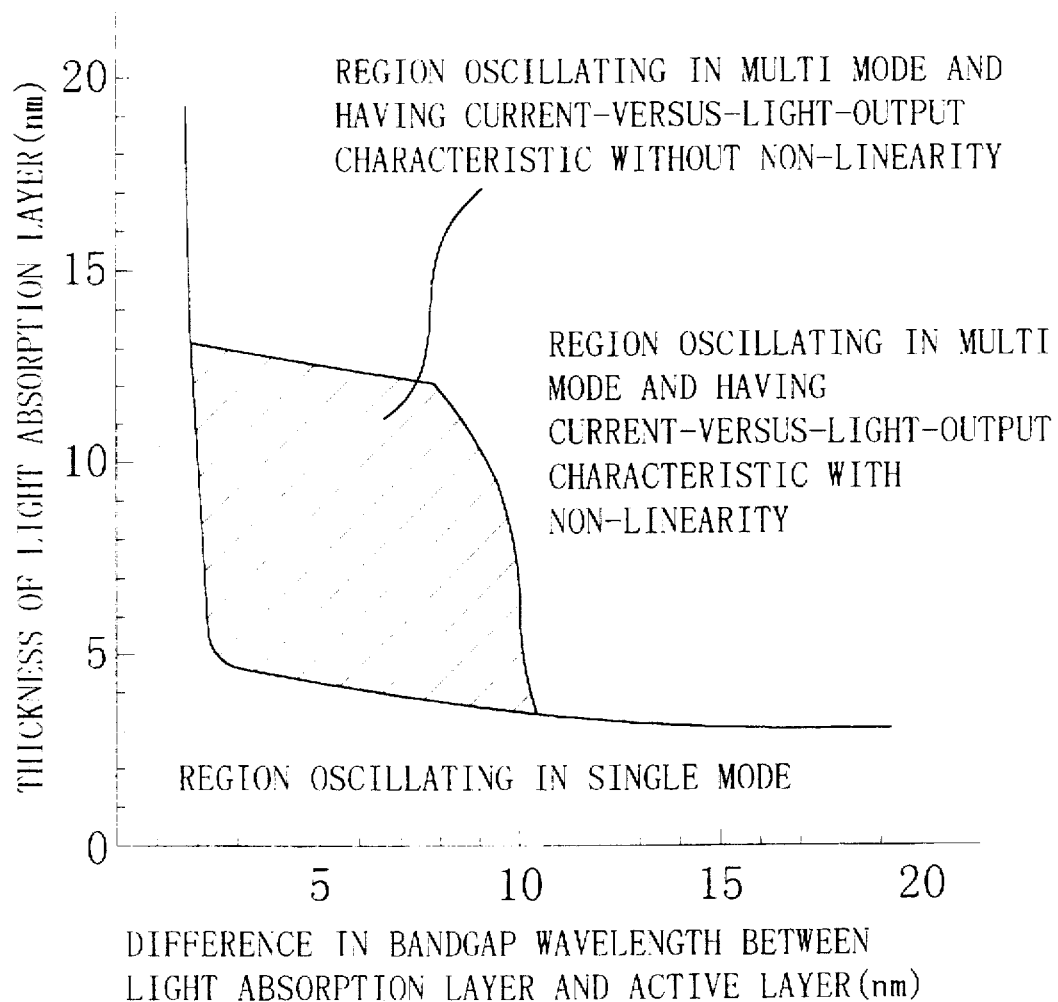
FIG. 6 shows the results of experiments representing the dependence of an oscillation spectrum characteristics on the difference $\Delta\lambda$ in bandgap wavelength and on the thickness of a loss varying layer and the presence or absence of non-linearity in the current-versus-light-output characteristics when the thickness of the active layer is 35 nm in the second embodiment.
Figure 7:
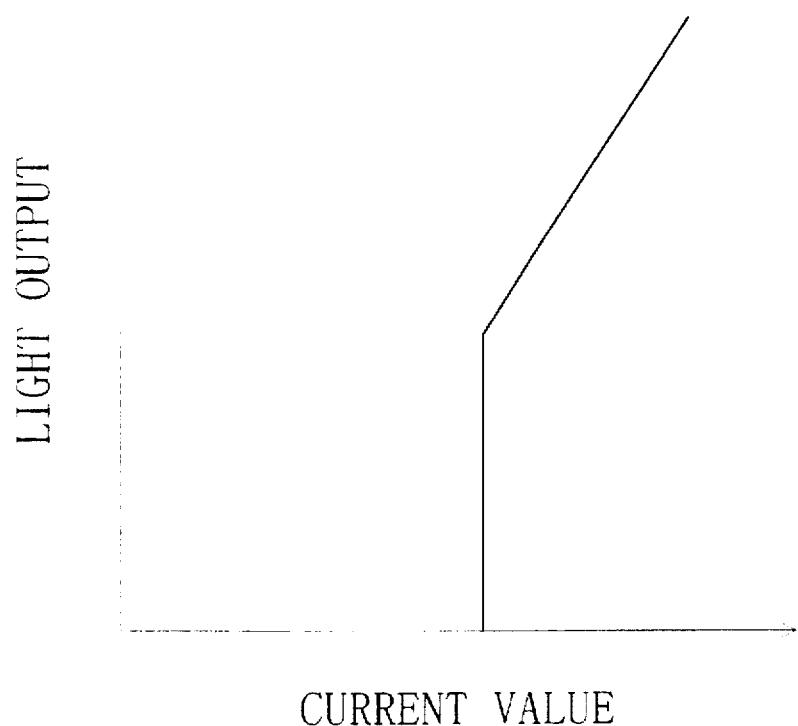
FIG. 7 illustrates non-linearity in the current-versus-light-output characteristics in a semiconductor laser device.

FIG. 6 shows the dependence of the oscillation spectrum characteristic on the difference $\Delta\lambda$ in bandgap wavelength and on the thickness of the loss varying layer 106 and the presence or absence of non-linearity in the current-versus-light-output characteristics.

Non-linearity in the current-versus-light-output characteristics are the phenomenon that the linearity of the current-versus-light-output characteristic is degraded and the light output is drastically increased after laser oscillation. When the linearity of the current-versus-light-output characteristics is degraded, APC (Automatic Power Control) driving for constantly providing a given light output in low-power operation required to reproduce information from the optical disk cannot be performed any more, which presents a great obstacle to the practical use of the semiconductor laser device.

From FIG. 6, it will be understood that non-linearity is observed in the current-versus-light-output characteristic when the difference $\Delta\lambda$ in bandgap wavelength surpasses 10 nm or when the thickness of the loss varying layer 106 surpasses 12 nm. This is because, when the difference $\Delta\lambda$ in bandgap wavelength surpasses 10 nm or when the thickness of the loss varying layer 106 surpasses 12 nm, the light absorption loss in the loss varying layer 106 is increased so that the amount of injected current required for laser oscillation is increased. Although the density of injected carriers in the active layer 104 is also increased, the increase in the carrier density in the active layer 104 lowers the differential gain of the active layer 104 and an increment in the gain obtained by the guided beam when the amount of injected current is increased is also reduced. On the other hand, the differential gain of the active layer 104 is further reduced by heat emission from the semiconductor laser device caused by the injected current. Consequently, it becomes necessary to further increase the amount of injected current to cause laser oscillation, with the result that the differential gain of the active layer 104 is further reduced under the influence of heat emission and the gain obtained by the guided beam is less likely to exceed the loss. In this manner, the threshold current for lasing oscillation is drastically increased till it reaches a given value at which the gain obtained by the guided beam exceeds the loss and laser oscillation occurs to drastically increase the light output. Since the carriers are excited by the oscillated lasing light in the loss varying layer 106 and hence the light absorption effect is drastically reduced, the light absorption loss undergone by the guided beam is drastically reduced. As a result, the gain obtained by the guided beam greatly surpasses the loss undergone thereby, which results in a drastic increase in light output after laser oscillation and non-linearity in the current-versus-light-output characteristics. Since the foregoing non-linearity in the current-versus-light-output characteristics presents a great obstacle to the practical use of the semiconductor laser device, it should be prevented.

As described above, according to the second embodiment, the loss varying layer 106 which absorbs the oscillated lasing light and exhibits saturable absorption is provided on the second optical guiding layer 105, while the thickness of the loss varying layer 106 is limited to the range of 5 nm to 12 nm, so that such self-sustained pulsation as to produce a multimode spectrum is implemented in the laser oscillation characteristics, while low-noise characteristics and current-versus-light-output characteristics with excellent linearity are provided. In short, laser oscillation is achieved when injected carriers are in such a density that the differential gain of the active layer 104 exhibits no tendency to be saturated.

Moreover, since the thickness of the loss varying layer 106 is 12 nm or less while the thickness of the active layer 104 is 35 nm, the volume of the loss varying layer 106 is not increased so that the absorption of the lasing light generated in the active layer 104 by the loss varying layer 106 is saturated without difficulty. Hence, it is not necessary to increase the gain obtained by the guided beam in the active layer 104 and therefore the amount of injected current, thereby preventing a significant increase in the value of operating current, an increase in the amount of heat emitted by the semiconductor laser device, and the degradation of reliability. Furthermore, since the thickness of the loss varying layer 106 is small, the optical field distribution in the vertical direction is not deformed so that no asymmetry is observed in the vertical beam pattern in a far-field image and hence a reduction in the efficiency with which the beam emitted from the semiconductor laser device is coupled with the lens.

The thickness of the loss varying layer 106 for providing the current-versus-light-output characteristics with excellent linearity varies with the thickness of the active layer 104. As the thickness of the active layer 104 is larger, the operating carrier density is reduced, so that the semiconductor laser device is operated at an operating point with a higher differential gain and the optical confinement factor in confining light in the active layer 104 is increased. Consequently, an increment in gain obtained by the guided beam responsive to an increase in injected current is increased so that non-linearity is less likely to appear in the current-versus-light-output characteristics.

Figure 8:
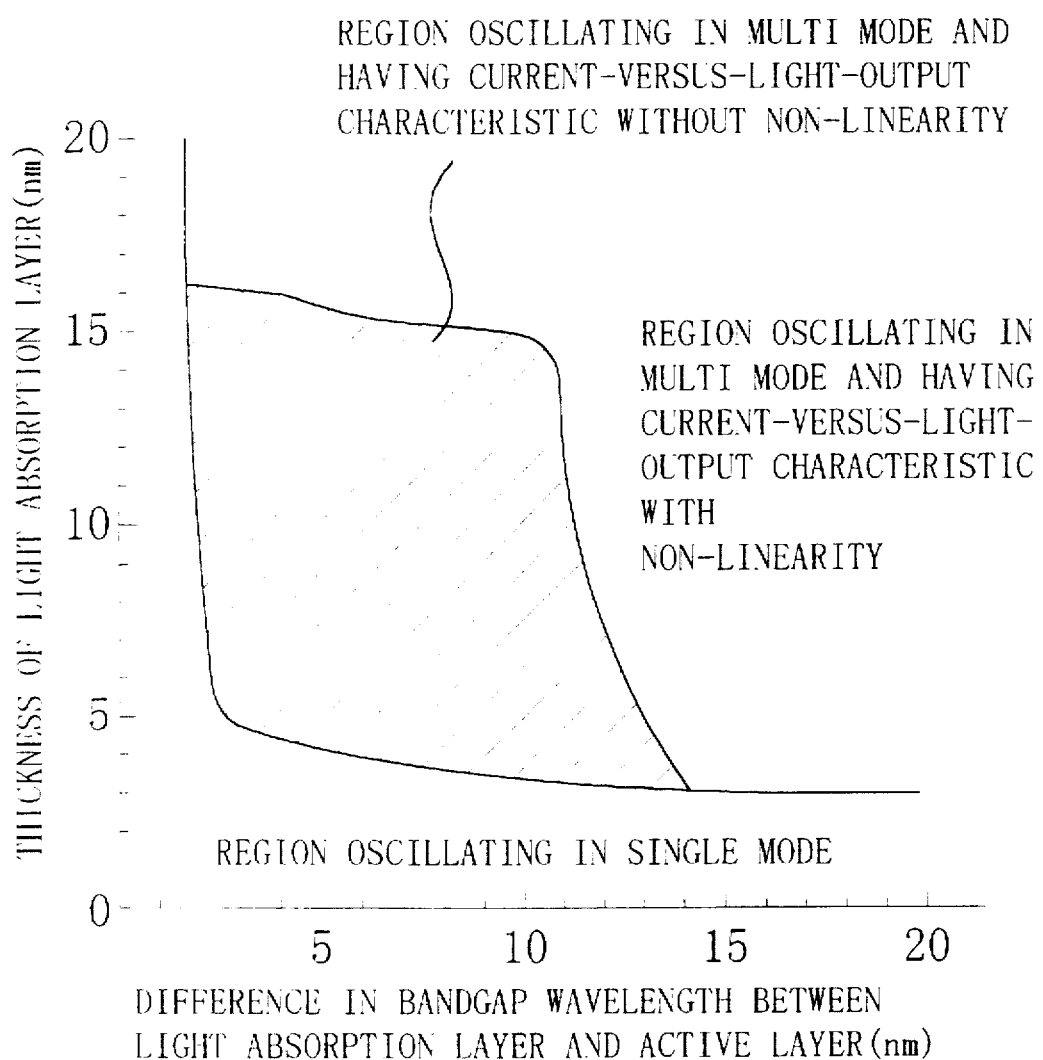
FIG. 8 shows the dependence of the oscillation spectrum characteristics on the difference in bandgap wavelength $\Delta\lambda$ and on the thickness of the loss varying layer and the presence or absence of non-linearity in the current-versus-light-output characteristics when the thickness of the active layer is 50 nm in a semiconductor laser device.

FIG. 8 shows the results of experiments representing the dependence of the oscillation spectrum characteristics on the difference $\Delta\lambda$ in bandgap wavelength and on the thickness of the loss varying layer 106 and the results of experiments representing the presence or absence of non-linearity in the current-versus-light-output characteristics. FIG. 8 shows the case where the thickness of the second optical guiding layer 105 is 0.1 μm, which enables stable oscillation in a fundamental transverse mode.

Figure 9:
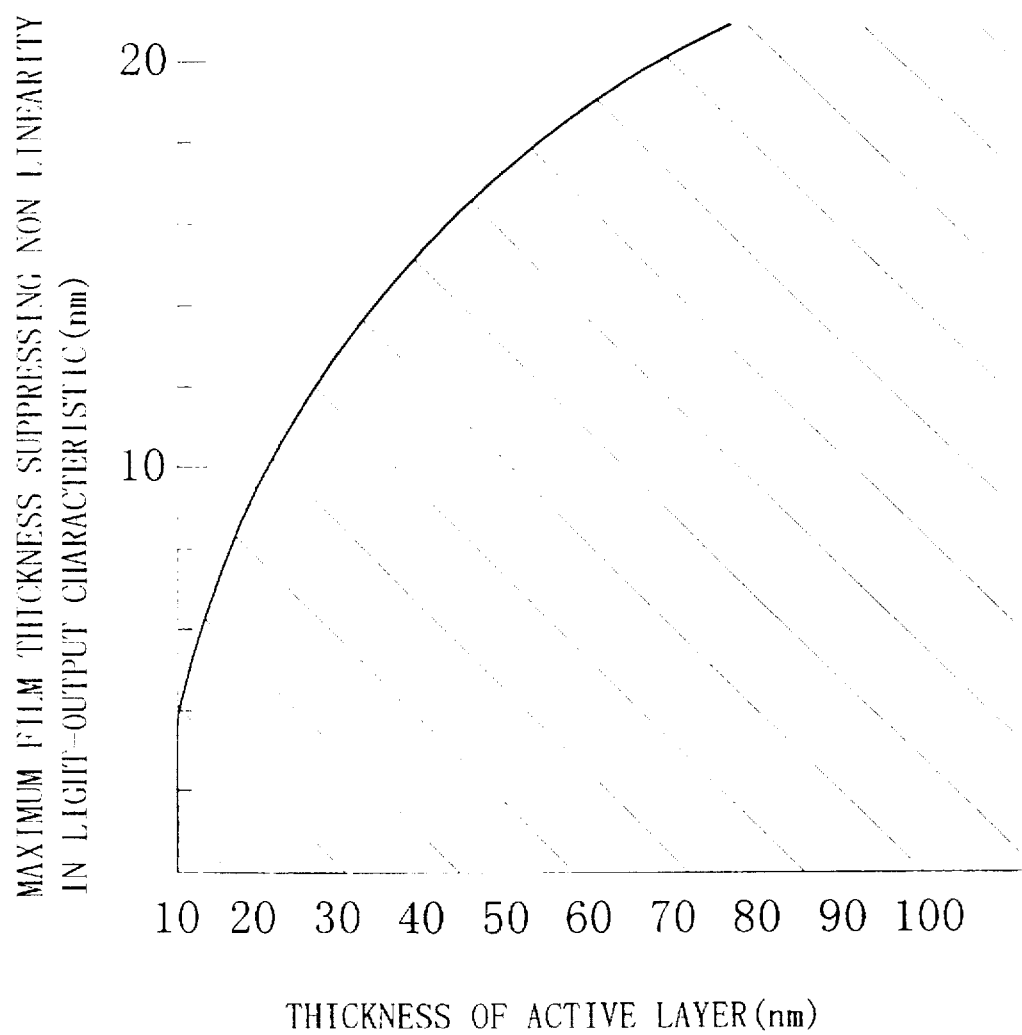
FIG. 9 shows a relationship between the thickness of the active layer and a maximum thickness of the loss varying layer suppressing non-linearity in the current-versus-light-output characteristics in a semiconductor laser device.

As can be seen from FIG. 8, the region which performs self-sustained pulsation is increased without producing non-linearity in the current-versus-light-output characteristics when the thickness of the active layer 104 is increased. This is because when the thickness of the active layer 104 is increased, an increment in gain obtained by the guided beam responsive to an increase in injected current is increased so that non-linearity is less likely to appear in the current-versus-light-output characteristics. It will be understood that, when the thickness of the active layer 104 is 50 nm, the loss varying layer 106 should have a thickness in the range of 5 nm to 16 nm. FIG. 9 shows a relationship between the thickness of the active layer 104 and a maximum thickness of the loss varying layer 106 suppressing non-linearity in the current-versus-light-output characteristics. If the thickness of the loss varying layer 106 falls in the hatched region shown in FIG. 9, self-sustained pulsation is achieved without causing non-linearity in the current-versus-light-output characteristics.

From the foregoing examinations, it will be appreciated that, when the thickness of the active layer 104 has a value in the range of 20 nm to 60 nm which has customarily been used, non-linearity is not observed in the current-versus-light-output characteristics if the loss varying layer 106 has a thickness obtained by adding 5 nm to one fifth of the thickness of the active layer 104.

In the case where a plurality of loss varying layers 106 are provided, if the total thickness of the plurality of loss varying layers 106 is equal to or less than a thickness obtained by adding 5 nm to one fifth of the thickness of the active layer 104, non-linearity is not observed in the current-versus-light-output characteristics. In the case where the loss varying layer 106 has a quantum well structure, if the total thickness of the individual well layers is equal to or less than a value obtained by adding 5 nm to one fifth of the thickness of the active layer 104, non-linearity is not observed in the current-versus-light-output characteristics. Below, the optical field distribution in the lateral direction and the astigmatic distance will be examined.

The optical field distribution in the lateral direction is determined by the width W of the current channel and the difference $\Delta n$ between the effective refractive indices inside and outside the current channel.

In the second embodiment, oscillation in a transverse mode in high-power operation is suppressed in the current blocking layer 108, while oscillation in a fundamental transverse mode is provided therein. Moreover, to reduce the threshold current for lasing oscillation, the width W of the current channel is adjusted to be 2.5 µm.

Figure 10:
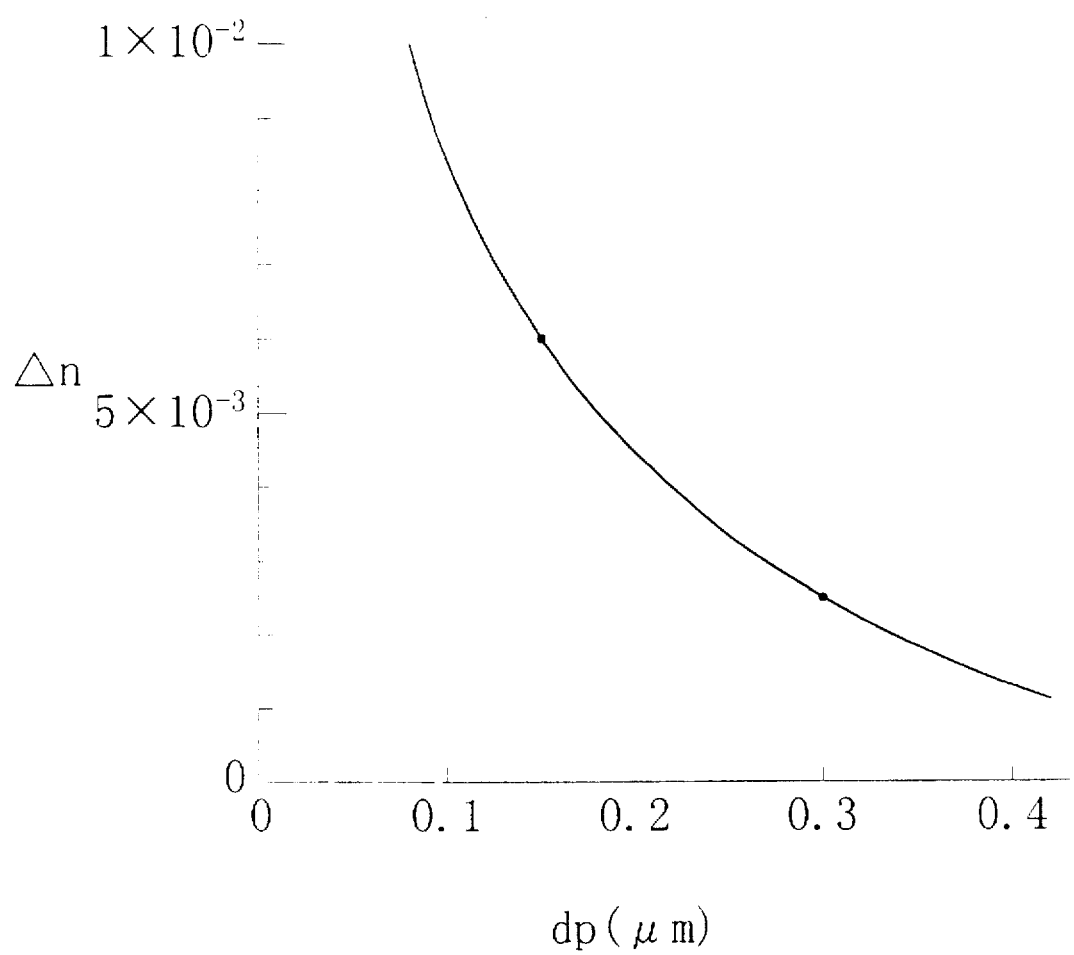
FIG. 10 shows the results of calculations representing the dependence of a difference $\Delta n$ between internal and external effective refractive indices on a total thickness dp of a second optical guiding layer and a light absorption film.

The difference $\Delta n$ between the refractive indices inside and outside the current channel is determined by the total thickness dp of the second optical guiding layer 105 and the loss varying layer 106. FIG. 10 shows the results of calculations representing the dependence of the difference $\Delta n$ between the internal and external effective refractive indices on the total thickness dp. The calculations were performed on the assumption that the thickness of the loss varying layer 106 was 10 nm. As shown in the drawing, the difference $\Delta n$ between the internal and external effective refractive indices becomes larger as the total thickness dp becomes smaller. To prevent a transition from the real refractive-index waveguide mechanism to the anti-refractive-index mechanism due to a reduction in effective refractive index inside the current channel resulting from the plasma effect which is caused by the injected current and to achieve steady oscillation in a fundamental transverse mode in both low-power and high-power operations, the difference $\Delta n$ between the internal and external effective refractive indices should have a value of $6 \times 10^{-3}$ or higher. Hence, it will be appreciated that the total thickness dp of the second optical guiding layer 105 and the loss varying layer 106 should have a value of 0.15 µm or less.

If the semiconductor laser device is fabricated such that the total thickness dp of the second optical guiding layer 105 and the loss varying layer 106 becomes 0.15 µm or less, stable oscillation in a fundamental transverse mode is performed, while the optical field distribution in the lateral direction is more tightly confined in the current channel, so that a light absorption loss undergone by the guided beam in a region of the active layer 104 underlying the current blocking layer 108 is reduced, thereby decreasing the threshold current for oscillation and the degree of bent of the wavefront of the guided beam in the lateral direction. The bent wavefront presents an obstacle to the practical use of the semiconductor laser device, since it produces an astigmatic distance and prevents the emitted beam from being focused as a spot by a lens. Hence, if the semiconductor laser device is fabricated such that the total thickness dp of the second optical guiding layer 105 and the loss varying layer 106 is equal to or smaller than 0.15 µm, the threshold current for lasing oscillation is decreased and an astigmatic distance of 1 µm or less is provided.

Although the dependence of the difference $\Delta n$ between the internal and external effective refractive indices on the total thickness dp shown in FIG. 10 has been calculated on the assumption that the thickness of the loss varying layer 106 is 10 nm, if the thickness of the loss varying layer 106 is 12 nm or less, the optical field distribution is substantially unaffected by the extremely small thickness of the loss varying layer 106. It will be appreciated that, when the total thickness dp of the second optical guiding layer 105 and the loss varying layer 106 is 0.15 µm or less, the difference $\Delta n$ between the internal and external effective refractive indices becomes $6 \times 10^{-3}$ or more.

Although the dependence of the difference $\Delta n$ between the internal and external effective refractive indices on the total thickness dp shown in FIG. 10 has been calculated on the assumption that the active layer 104 has a thickness of 35 nm, it will be appreciated that the foregoing description will also apply to the case where the thickness of the active layer 104 is in the range of 20 nm to 60 nm customarily used.

It will be appreciated that, even in the case where a plurality of loss varying layers 106 are provided between the active layer 104 and the current blocking layers 108 or where no loss varying layer 106 is provided between the active layer 104 and the current blocking layers 108, the foregoing description also holds true provided that the total thickness of the semiconductor layers interposed between the active layer 104 and the current blocking layers 108 is 0.15 µm or less.

Since the total thickness dp of the second optical guiding layer 105 and the loss varying layer 106 is as small as 0.11 µm in the second embodiment, the optical field distribution under the current blocking layers 107 is localized to the side of the semiconductor substrate 101, resulting in a reduction in the effective refractive index of the optical field distribution underneath the current blocking layers 107. As a result, the difference $\Delta n$ between the effective refractive indices inside and outside the current channel can have a value as large as $8 \times 10^{-3}$, so that the optical field distribution in the lateral direction is confined in the current channel. Consequently, the spreading out of the optical field distribution from the current channel is reduced so that the light absorption loss undergone by the guided beam in the current blocking layer 108 and in the region of the active layer 104 underlying the stripe region 107 is reduced and the astigmatic distance is also reduced.

Figure 11:
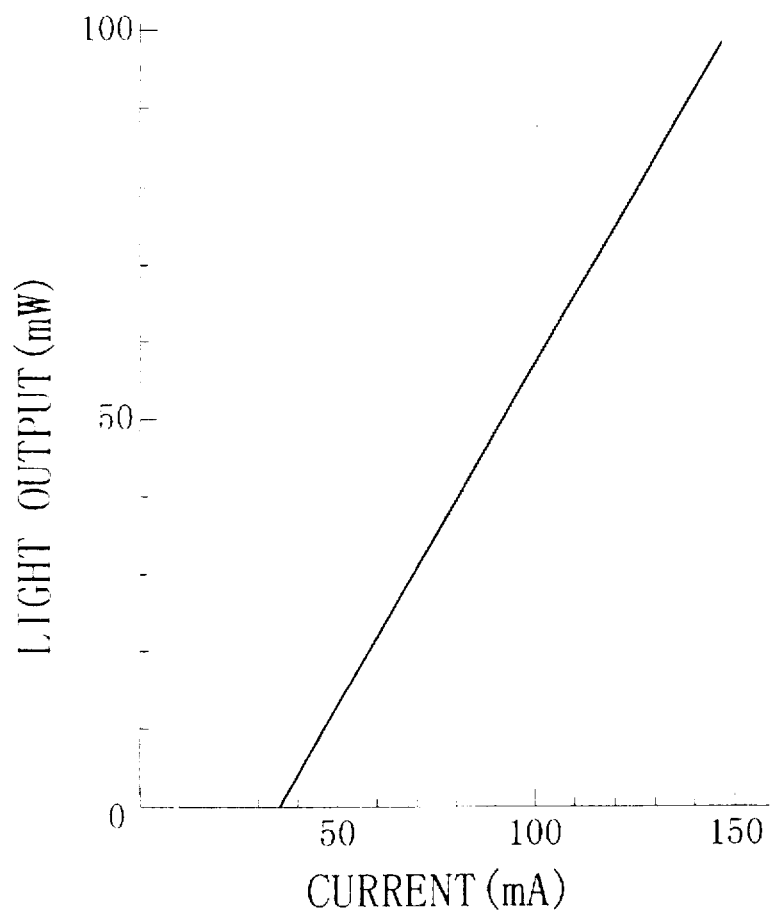
FIG. 11(a) shows the current-versus-light-output characteristics of the semiconductor laser device according to the second embodiment and FIG. 11(b) shows the current-versus-light-output characteristics of a conventional semiconductor laser device of self-sustained-pulsation type having a loss varying layer.
Figure 11:
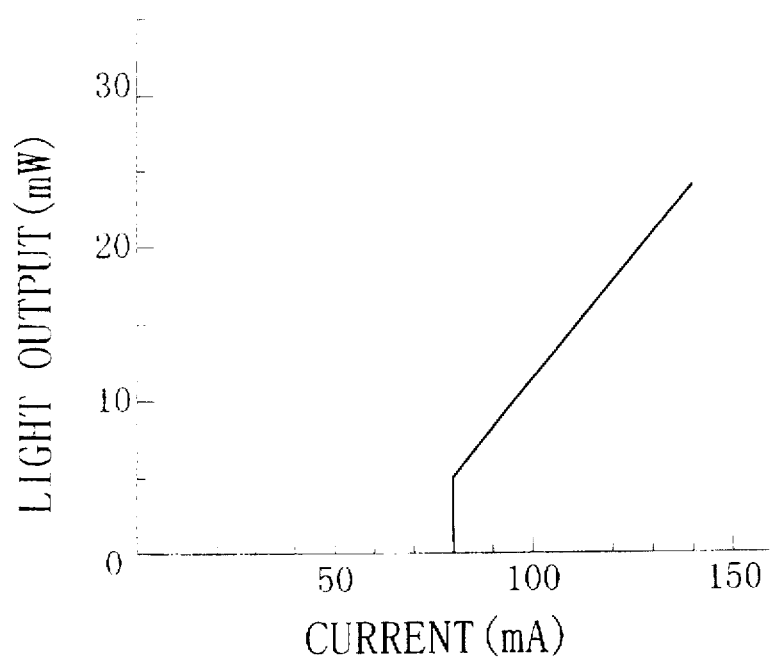

FIG. 11(a) shows the current-versus-light-output characteristics of the semiconductor laser device according to the second embodiment. FIG. 11(b) shows the current-versus-light-output characteristics of the conventional semiconductor laser device having a loss varying layer. The length of the resonator of each of the semiconductor laser devices used for measurement is 400 µm.

It will be understood from the drawings that the light output from the conventional semiconductor laser device has drastically increased till it reaches a value of about 5 mW. With such characteristics, if a light output of about 3 mW is required to read information from an optical disk, the light output should be maintained at a constant value, which disables APC driving and presents a great obstacle to the practical use of the semiconductor laser device.

In the semiconductor laser device according to the second embodiment, however, the threshold current for oscillation is 35 mA and a maximum light output obtainable is 100 mA. In addition, non-linearity which disables the APC driving is not observed in the current-versus-light-output characteristic so that characteristics with excellent linearity are obtained. Moreover, stable oscillation is performed in a fundamental transverse mode. The multimode oscillation spectrum which causes self-sustained pulsation at a wavelength of about 780 nm is produced and RIN (Relative Intensity Noise) has a value of −130 dB/Hz or less when the feedback ratio ranges between 0% and 10%, so that low-noise characteristics are obtained. Furthermore, the astigmatic distance is as small as 0.3 µm.

Below, a description will be given to the AlAs mole fraction of each of the layers composing the semiconductor laser device according to the second embodiment.

The description will be given first to a relationship between the AlAs mole fraction of each of the first to third optical guiding layers and the AlAs mole fraction of the active layer 104.

In employing a lasing light at a wavelength of about 780 nm for use in an optical pickup device such as an optical disk, the second embodiment has adjusted the AlAs mole fraction of each of the first to third optical guiding layers 103, 105, and 109 to be 0.5, thereby preventing the overflow of injected carriers from the active layer 104 and effectively confining the carriers in the active layer 104. However, it will be appreciated that the carriers can effectively be confined in the active layer 104 as long as the AlAs mole fraction of each of the first to third optical guiding layers 103, 105, and 109 is larger than 0.15, which is the AlAs mole fraction of the active layer 104, by at least 0.3.

The description will be given below to the bandgap wavelength (the wavelength of light corresponding to the energy of a bandgap) of the loss varying layer 106.

To obtain the saturable absorption effect by causing the loss varying layer 106 to absorb a lasing light, it is necessary to provide the loss varying layer 106 having a bandgap wavelength larger than that of the active layer 104. If the bandgap wavelength difference $\Delta\lambda$ which is a difference between the bandgap wavelength of the loss varying layer 106 and the bandgap wavelength of the active layer 104 (obtained by subtracting the bandgap wavelength of the active layer 104 from the bandgap wavelength of the loss varying layer 106) is smaller than 2 nm, the carriers are excited by an oscillated lasing light from the active layer 104 and the loss varying layer 106 easily becomes transparent to the lasing light. Accordingly, the saturable absorption effect achieved by the loss varying layer 106 is lessened in low-power operation with 1 mW or less and self-sustained pulsation does not occur in operation with 1 mW or more.

Conversely, if the bandgap wavelength difference $\Delta\lambda$ is larger than 10 nm, the light absorption by the loss varying layer 106 becomes excessively large so that a saturation of the light absorption is not observed. To cause laser oscillation in that case, it is necessary to increase the amount of injected current with a view to compensating for the light absorption loss in the loss varying layer 106 and thereby increase a gain obtained by the guided beam in the active layer 104. However, if the amount of injected current is increased, the threshold current for oscillation is greatly increased, while an external differential quantum efficiency is reduced.

To provide self-sustained pulsation without greatly increasing the threshold current for oscillation, it is required to fabricate the semiconductor laser device such that the bandgap wavelength difference $\Delta\lambda$ ranges between 2 nm and 10 nm. Therefore, the second embodiment has adjusted the AlAs mole fraction of the loss varying layer 106 to be 0.14, which is smaller than the AlAs mole fraction of the active layer 104 by 0.01, to provide a bandgap wavelength difference $\Delta\lambda$ of 6 nm.

Below, a method of manufacturing a semiconductor laser device according to the second embodiment will be described with reference to FIGS. 12(a) to 12(c).

Figure 12A:
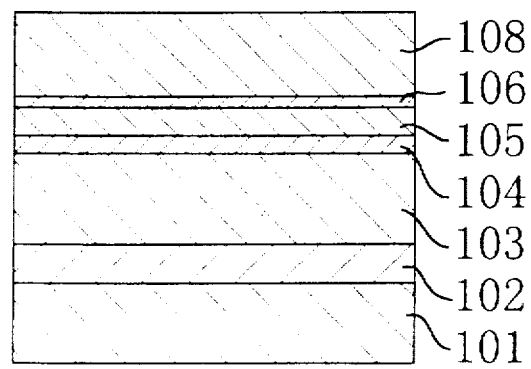
FIGS. 12(a) to 12(c) are cross-sectional views illustrating the individual steps of a method of manufacturing a semiconductor laser device according to the first embodiment.

First, as shown in FIG. 12(a), the buffer layer 102 composed of n-type GaAs and having a thickness of 0.5 µm, the first optical guiding layer 103 composed of n-type $Ga_{0.5}Al_{0.5}As$ and having a thickness of 2.0 µm, the active layer 104 composed of $Ga_{0.85}Al_{0.15}As$ and having a thickness of 0.06 µm, the second optical guiding layer 105 composed of p-type $Ga_{0.5}Al_{0.5}As$ and having a thickness of 0.1 µm, the loss varying layer 106 composed of p-type $Ga_{0.86}Al_{0.14}As$ and having a thickness of 0.01 µm, and the current blocking layers 108 each composed of $Ga_{0.35}Al_{0.65}As$ and having a thickness of 1.0 µm are formed sequentially on the semiconductor substrate 101 composed of n-type GaAs.

Figure 12B:
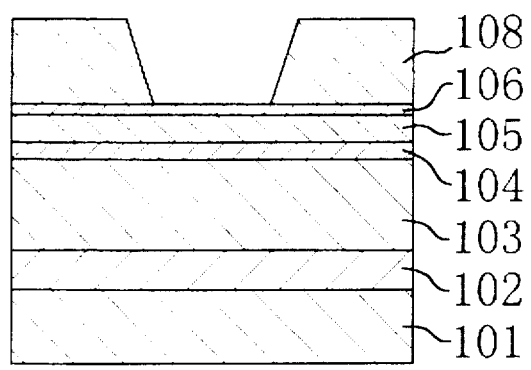

Next, as shown in FIG. 12(b), etching is performed with respect to the current blocking layers 108 by using a photolithographic technique, thereby forming an inwardly tapered trench with a width of 2.5 µm serving as the stripe region 107. The trench is preferably inwardly tapered rather than outwardly tapered, since crystal growth is more difficult in the outwardly tapered trench than in the inwardly tapered trench, so that degraded characteristics may cause a reduction in production yield. In an outwardly tapered trench actually formed, the crystal property of the GaAlAs was impaired at both ends of the stripe region 107 and the threshold current of the resulting semiconductor laser device was higher than in the case where the trench is inwardly tapered by about 10 mA.

Figure 12C:
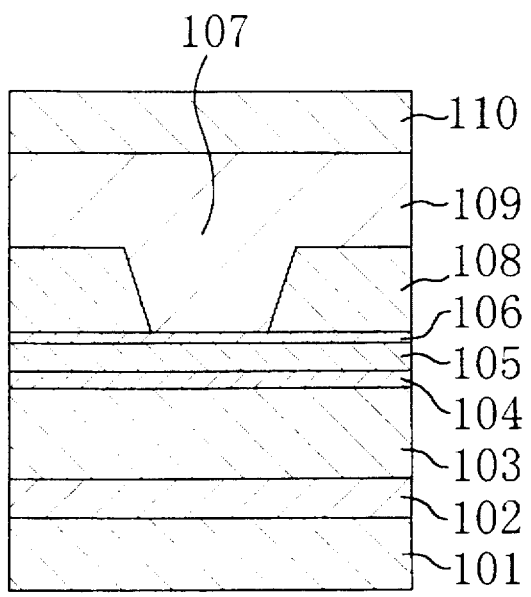

Next, as shown in FIG. 12(c), the p-type $Ga_{0.5}Al_{0.5}As$ layer is grown on the loss varying layer 106 by MOCVD or MBE to form the stripe region 107 having a width of 2.5 µm on the central portion of the loss varying layer 106, while the third optical guiding layer 109 composed of p-type $Ga_{0.5}Al_{0.5}As$ and having a thickness of 2.0 µm is formed over the stripe region 107 and the current blocking layers 108. Thereafter, a contact layer 110 composed of p-type GaAs and having a thickness of 2.0 µm is formed on the third optical guiding layer 109 by regrowth process. In this case, if Zn is used as a dopant in the p-type $Ga_{0.5}Al_{0.5}As$ layer composing the third optical guiding layer 109, it is required to adjust the carrier density to be $10^{18} cm^{-3}$ or less at least at the regrowth interface, thereby preventing the influence of Zn diffused into the stripe region 107 during regrowth process on characteristics. In the second embodiment, the carrier density is $7 \times 10^{17} cm^{-3}$. As a dopant, a substance with lower diffusivity, such as carbon, may be used instead. After that, respective electrodes are formed on the back surface of the semiconductor substrate 101 and on the top surface of the contact layer 110, though the drawing thereof is omitted here.

(Third Embodiment)

Figure 13:
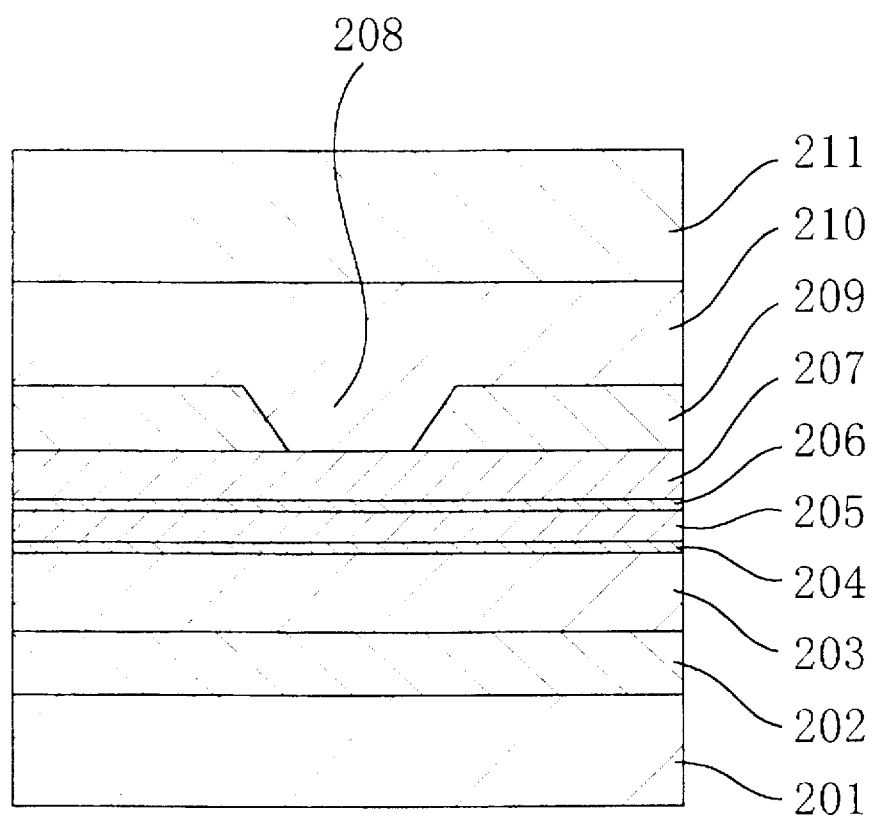
FIG. 13 is a cross-sectional view of a semiconductor laser device according to a third embodiment.

Referring now to FIG. 13, a semiconductor laser device according to a third embodiment of the present invention will be described.

FIG. 13 shows a cross-sectional structure of the semiconductor laser device according to the third embodiment. As shown in the drawing, a buffer layer 202 composed of n-type GaAs, a first optical guiding layer 203 composed of n-type $Ga_{0.5}Al_{0.5}As$, a loss varying layer 204 composed of p-type $Ga_{0.86}Al_{0.14}As$, a first optical guiding layer 205 composed of n-type $Ga_{0.54}Al_{0.5}As$, an active layer 206 composed of $Ga_{0.85}Al_{0.15}As$, and a second optical guiding layer 207 composed of p-type $Ga_{0.5}Al_{0.5}As$ are formed sequentially on a semiconductor substrate 201 composed of n-type GaAs. On the central portion of the second optical guiding layer 207, there is formed a stripe region 208 composed of p-type $Ga_{0.5}Al_{0.5}As$. On both sides of the stripe region 208 on the second optical guiding layer 207, there are formed current blocking layers 209 composed of n-type $Ga_{0.35}Al_{0.65}As$. Over the stripe region 208 and the current blocking layers 209, a third optical guiding layer 210 composed of p-type $Ga_{0.5}Al_{0.5}As$ is formed integrally with the stripe region 208, on which is formed a contact layer 211 composed of p-type GaAs. In the third embodiment, the thickness of the loss varying layer 204 ranges between 5 nm and a thickness obtained by adding 5 nm to one fifth of the thickness of the active layer 206, while the thickness of the second optical guiding layer 207 is 0.15 μm or less.

(Fourth Embodiment)

Figure 14:
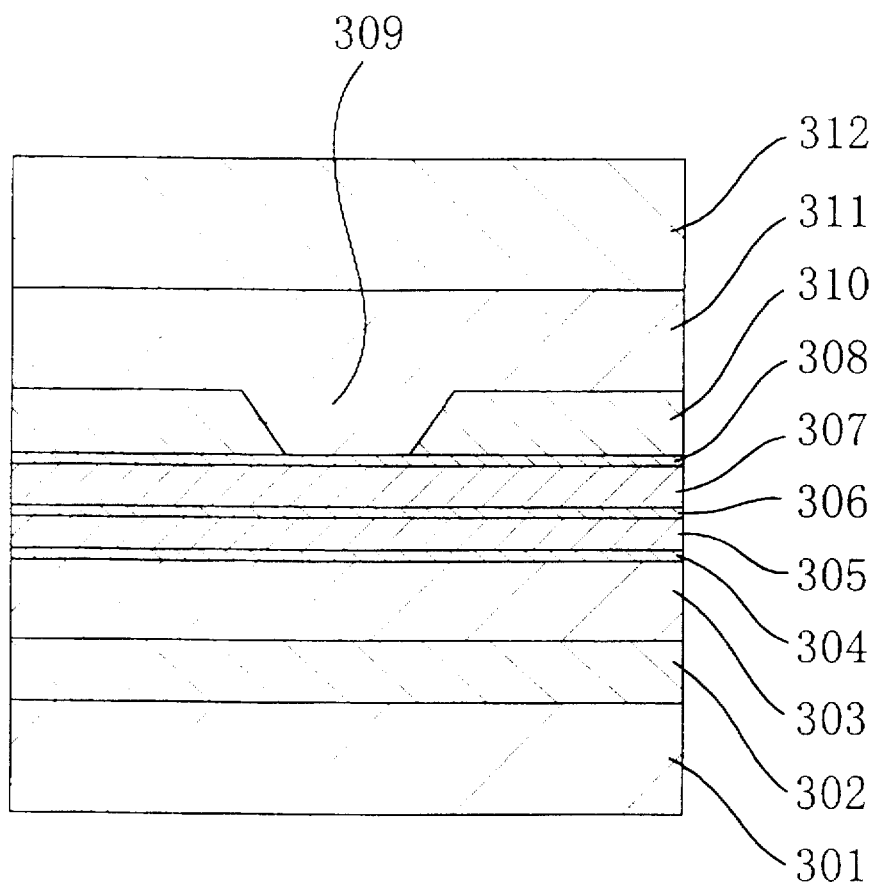
FIG. 14 is a cross-sectional view of a semiconductor laser device according to a fourth embodiment.

FIG. 14 shows a cross-sectional structure of a semiconductor laser device according to a fourth embodiment. As shown in FIG. 14, a buffer layer 302 composed of n-type GaAs, a first optical guiding layer 303 composed of n-type $Ga_{0.5}Al_{0.5}As$, a loss varying layer 304 composed of p-type $Ga_{0.86}Al_{0.14}As$, a first optical guiding layer 305 composed of n-type $Ga_{0.5}Al_{0.5}As$, an active layer 306 composed of $Ga_{0.85}Al_{0.15}As$, a second optical guiding layer 307 composed of p-type $Ga_{0.5}Al_{0.5}As$, and a third optical guiding layer 308 composed of $Ga_{0.8}Al_{0.2}As$ are formed sequentially on a semiconductor substrate 301 composed of n-type GaAs. On the central portion of the third optical guiding layer 308, there is formed a stripe region 309 composed of p-type $Ga_{0.5}Al_{0.5}As$. On both sides of the stripe region 309 on the third optical guiding layer 308, there are formed current blocking layers 310 composed of n-type $Ga_{0.35}As_{0.65}As$. Over the stripe region 309 and current blocking layers 310, a fourth optical guiding layer 311 composed of p-type $Ga_{0.5}Al_{0.5}As$ is formed integrally with the stripe region 309, on which is formed a contact layer 312 composed of p-type GaAs. In the fourth embodiment, the thickness of the loss varying layer 304 ranges between 5 nm and a thickness obtained by adding 5 nm to one fifth of the thickness of the active layer 306, while the total thickness of the second optical guiding layer 307 and the third optical guiding layer 308 is 0.15 μm or less.

(Fifth Embodiment)

Figure 15:
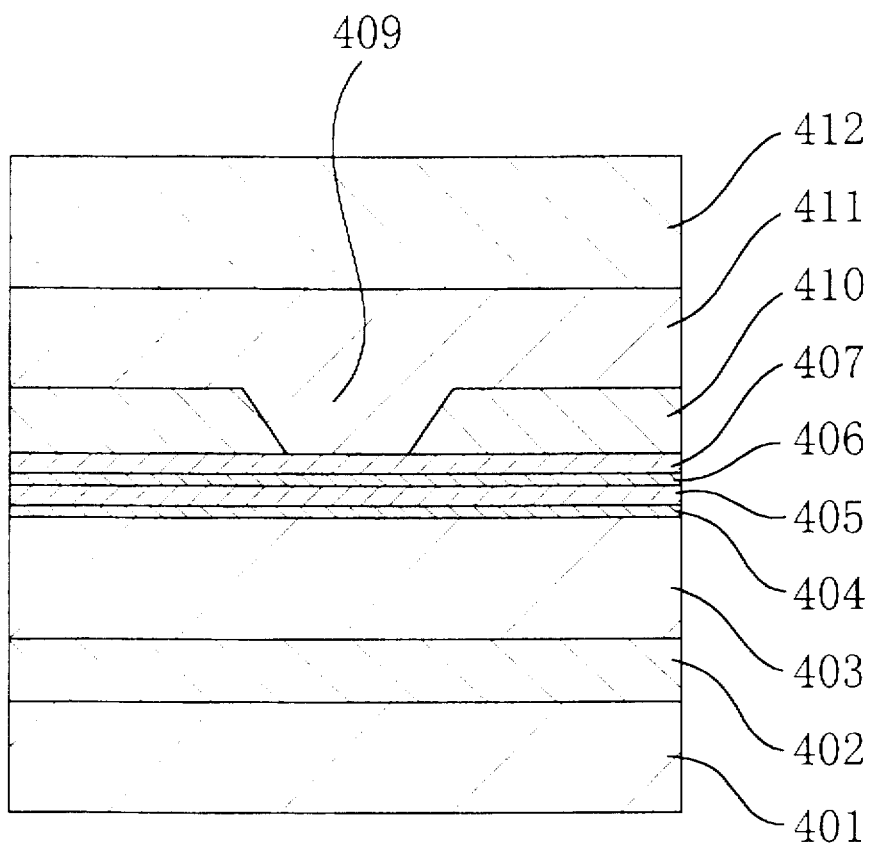
FIG. 15 is a cross-sectional view of a semiconductor laser device according to a fifth embodiment.

FIG. 15 shows a cross-sectional structure of a semiconductor laser device according to a fifth embodiment. As shown in the drawing, a buffer layer 402 composed of n-type GaAs, a first optical guiding layer 403 composed of n-type $Ga_{0.5}Al_{0.5}As$, an active layer 404 composed of $Ga_{0.8}Al_{0.15}As$, a second optical guiding layer 405 composed of p-type $Ga_{0.5}Al_{0.5}As$, a loss varying layer 406 composed of p-type $Ga_{0.86}Al_{0.14}As$, and a second optical guiding layer 407 composed of $Ga_{0.5}Al_{0.5}As$ are formed sequentially on a semiconductor substrate 401 composed of n-type GaAs. On the central portion of the second optical guiding layer 407, there is formed a stripe region 409 composed of p-type $Ga_{0.5}Al_{0.5}As$. On both sides of the stripe region 409 on the second optical guiding layer 407, there are formed current blocking layers 410 composed of n-type $Ga_{0.35}Al_{0.65}As$. Over the stripe region 409 and the current blocking layers 410, a third optical guiding layer 411 composed of p-type $Ga_{0.5}Al_{0.5}As$ is formed integrally with the stripe region 409, on which is formed a contact layer 412 composed of p-type GaAs is formed. In the fifth embodiment, the thickness of the loss varying layer 406 ranges between 5 nm and a thickness obtained by adding 5 nm to one fifth of the thickness of the active layer 404, while the total thickness of the two second optical guiding layers 405 and 407 and the loss varying layer 406 interposed therebetween is 0.15 μm or less.

(Sixth Embodiment)

Figure 16:
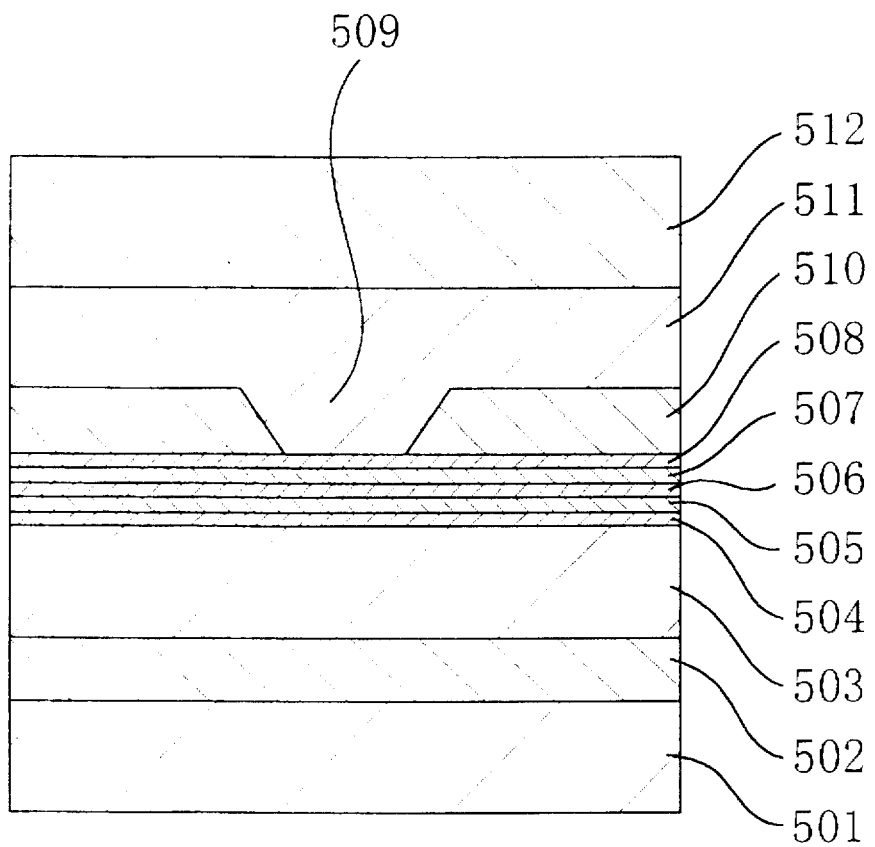
FIG. 16 is a cross-sectional view of a semiconductor laser device according to a sixth embodiment.

FIG. 16 shows a cross-sectional structure of a semiconductor laser device according to a sixth embodiment. As shown in the drawing, a buffer layer 502 composed of n-type GaAs, a first optical guiding layer 503 composed of n-type $Ga_{0.5}Al_{0.5}As$, an active layer 504 composed of $Ga_{0.85}Al_{0.15}As$, a second optical guiding layer 505 composed of p-type $Ga_{0.5}Al_{0.5}As$, a loss varying layer 506 composed of p-type $Ga_{0.86}Al_{0.14}As$, a second optical guiding layer 507 composed of p-type $Ga_{0.5}Al_{0.5}As$, and a third optical guiding layer 508 composed of p-type $Ga_{0.8}Al_{0.2}As$ are formed sequentially on a first semiconductor substrate 501 composed of n-type GaAs. On the central portion of the third optical guiding layer 508, there is formed a stripe region 509 composed of p-type $Ga_{0.5}Al_{0.5}As$. On both sides of the stripe region 509 on the third optical guiding layer 508, there are formed current blocking layers 510 composed of n-type $Ga_{0.35}Al_{0.65}As$. Over the stripe region 509 and the current blocking layers 510, a fourth optical guiding layer 511 composed of p-type $Ga_{0.5}Al_{0.5}As$ is formed integrally with the stripe region 509, on which is formed a contact layer 512 composed of p-type GaAs. In the sixth embodiment, the thickness of the loss varying layer 506 ranges between 5 nm and a thickness obtained by adding 5 nm to one fifth of the thickness of the active layer 504, while the total thickness of the two second optical guiding layers 505 and 507, the loss varying layer 506 interposed therebetween, and third optical guiding layer 508 is 0.15 μm or less.

(Seventh Embodiment)

Figure 17:
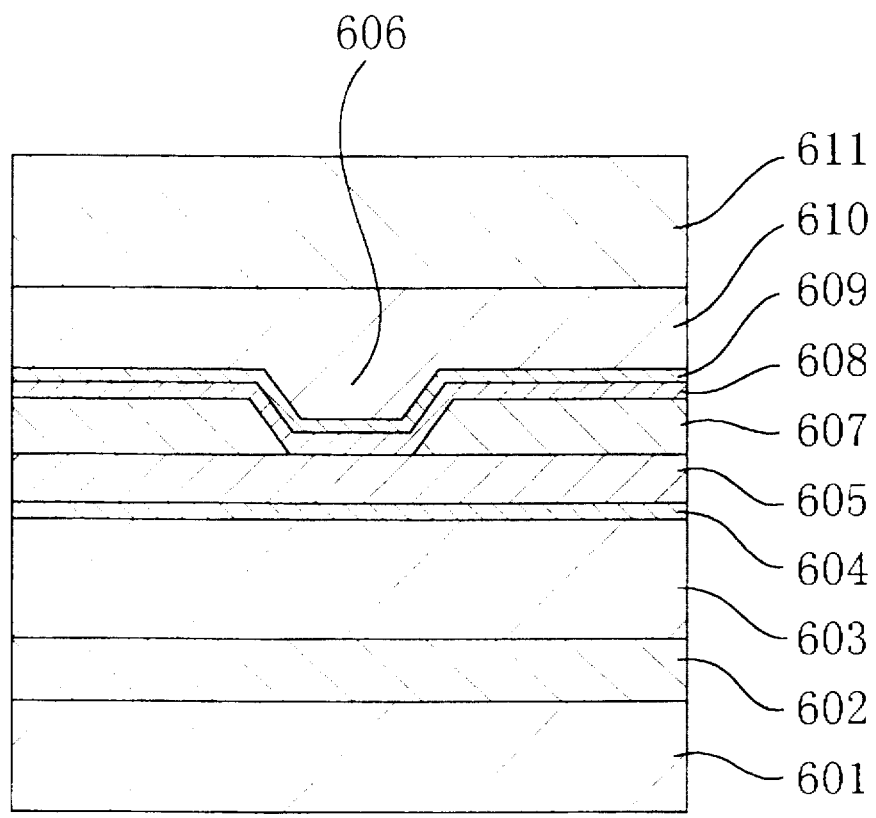
FIG. 17 is a cross-sectional view of a semiconductor laser device according to a seventh embodiment.

FIG. 17 shows a cross-sectional structure of a semiconductor laser device according to a seventh embodiment. As shown in the drawing, a buffer layer 602 composed of n-type GaAs, a first optical guiding layer 603 composed of n-type $Ga_{0.5}Al_{0.5}As$, an active layer 604 composed of $Ga_{0.85}Al_{0.15}As$, and a second optical guiding layer 605 composed of p-type $Ga_{0.5}Al_{0.5}As$ are formed sequentially on a semiconductor substrate 601 composed of n-type GaAs. On the central portion of the second optical guiding layer 605, there is formed a stripe region 606 composed of $Ga_{0.5}Al_{0.5}As$, while current blocking layers 607 composed of n-type $Ga_{0.35}Al_{0.65}As$ are formed on the entire area except for the central portion of the second optical guiding layer 605. On the current blocking layers 607, a third optical guiding layer 608 composed of p-type $Ga_{0.5}Al_{0.5}As$ is formed integrally with the stripe region 606. Over the stripe region 606 and the third optical guiding layer 608, there is formed a loss varying layer 609 composed of p-type $Ga_{0.86}Al_{0.14}As$, on which is formed a fourth optical guiding layer 610 composed of p-type $Ga_{0.5}Al_{0.5}As$. Over the fourth guiding layer 610, there is formed a p-type contact layer 611 of GaAs. In the seventh embodiment, the thickness of the loss varying layer 609 ranges from 5 nm to a thickness obtained by adding 5 nm to one fifth of the thickness of the active layer 604, while the thickness of the second optical guiding layer 605 is 0.15 μm or less.

(Eighth Embodiment)

Figure 18:
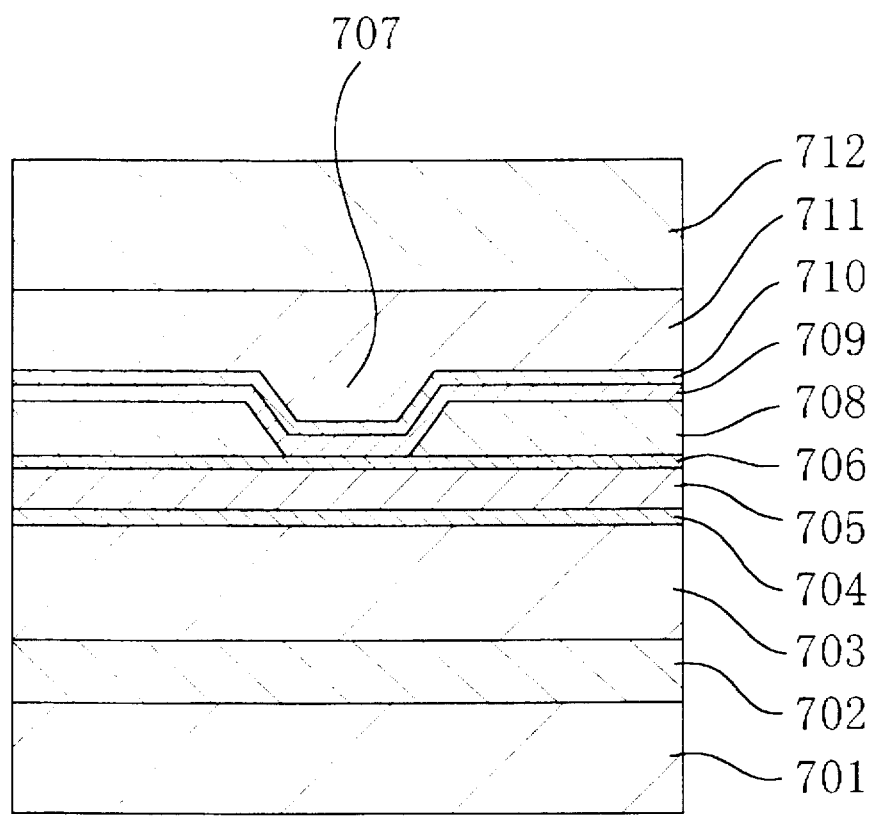
FIG. 18 is a cross-sectional view of a semiconductor laser device according to an eighth embodiment.

FIG. 18 shows a cross-sectional structure of a semiconductor laser device according to an eighth embodiment. As shown in the drawing, a buffer layer 702 composed of n-type GaAs, a first optical guiding layer 703 composed of n-type $Ga_{0.5}Al_{0.5}As$, an active layer 704 composed of $Ga_{0.85}Al_{0.15}As$, a second optical guiding layer 705 composed of p-type $Ga_{0.5}Al_{0.5}As$, and a third optical guiding layer 706 composed of p-type $Ga_{0.8}Al_{0.2}As$ are formed sequentially on a semiconductor substrate 701 composed of n-type GaAs. On the central portion of the third optical guiding layer 706, there is formed a stripe region 706 composed of p-type $Ga_{0.5}Al_{0.5}As$, while current blocking layers 708 composed of n-type $Ga_{0.35}Al_{0.65}As$ are formed on the entire area except for the central portion of the third optical guiding layer 706. On the current blocking layers 708, a fourth optical guiding layer 709 composed of p-type $Ga_{0.5}Al_{0.5}As$ is formed integrally with the stripe region 707. Over the stripe region 707 and the fourth optical guiding layer 709, there is formed a loss varying layer 710 composed of p-type $Ga_{0.86}Al_{0.14}As$, on which is formed a fourth optical guiding layer 711 composed of p-type $Ga_{0.5}Al_{0.5}As$. On the fourth optical guiding layer 711, there is formed a contact layer 712 composed of p-type GaAs. In the eighth embodiment, the thickness of the loss varying layer 710 ranges between 5 nm and a thickness obtained by adding 5 nm to one fifth of the thickness of the active layer 704, while the total thickness of the second optical guiding layer 705 and the third optical guiding layer 706 is 0.15 μm or less.

Although each of the above embodiments has shown the case where the n-type semiconductor substrate is used and the n-type current blocking layers are formed, it is also possible to use a p-type semiconductor substrate and form p-type current blocking layers instead.

Although each of the above embodiments has shown the case where the current blocking layers are positioned above the active layer, i.e., where the current blocking layers are positioned on the side opposite to the semiconductor substrate relative to the active layer, the same effects are achieved even in the case where the current blocking layers are on the same side as the semiconductor substrate relative to the active layer. It will be appreciated that, when current blocking layers are provided in two layers above and below the active layer to provide a double confinement structure, a leakage current is reduced and hence the operating current is further decreased.

When the active layer is provided with a multiple-quantum-well (MQW) structure in each of the above embodiments, the threshold current for lasing oscillation is reduced and the operating current is decreased.

Figure 19:
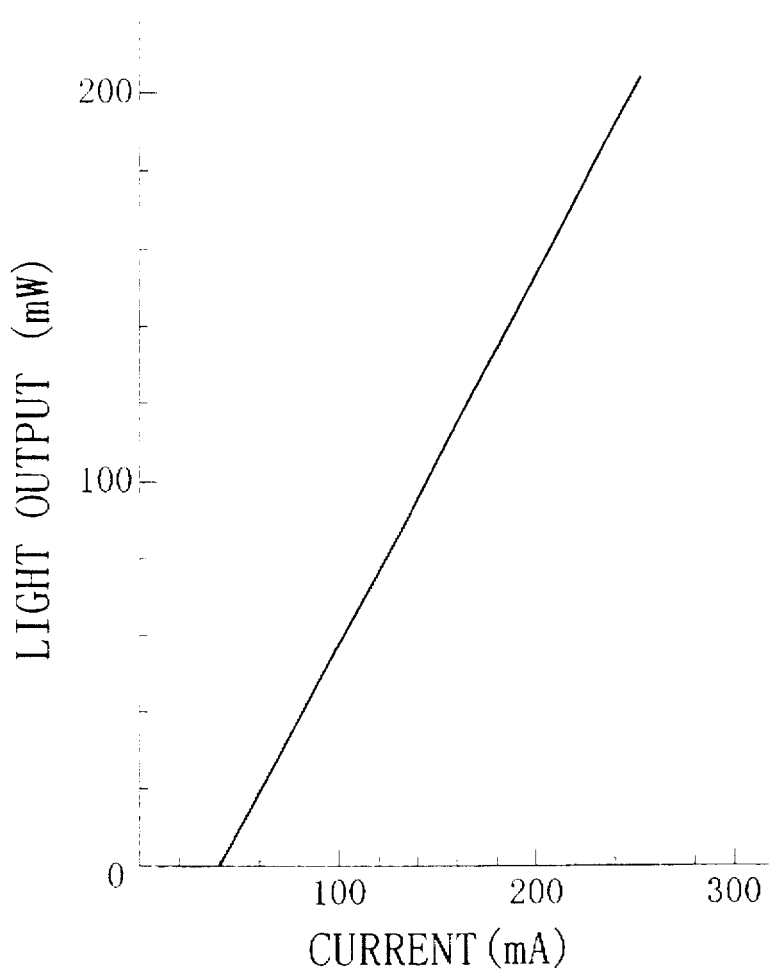
FIG. 19 shows current-versus-light-output characteristics when an active layer of multiple-quantum-well structure is used in the semiconductor laser device according to the second embodiment.
Figure 20:
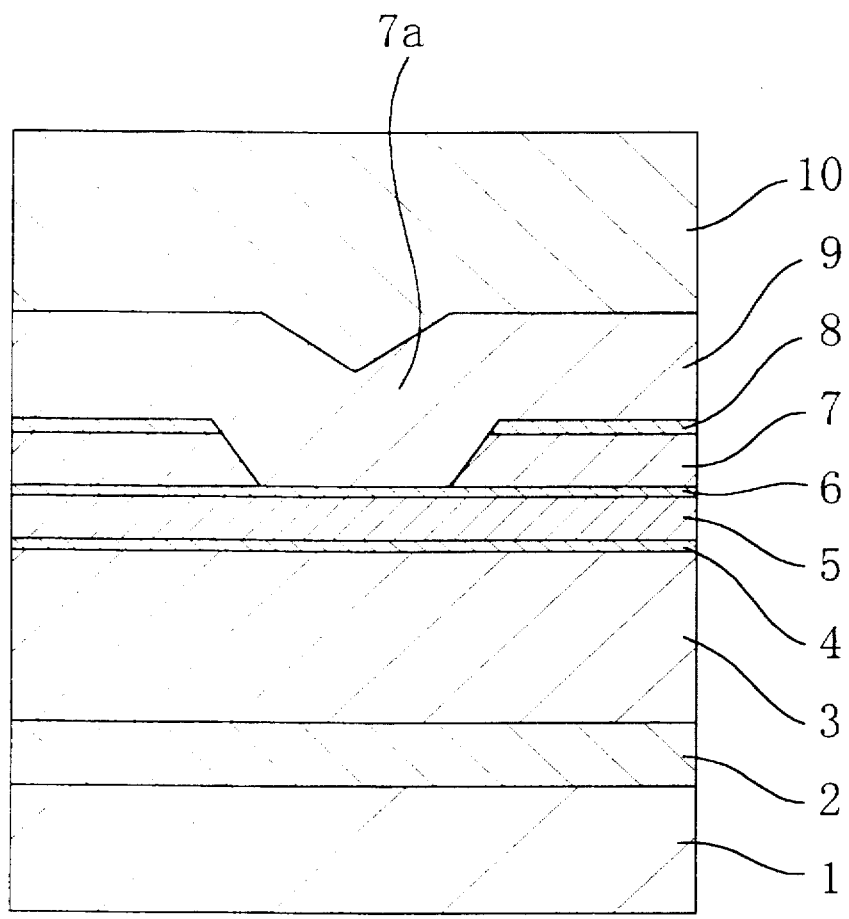
FIG. 20 is a cross-sectional view of a first conventional semiconductor laser device.
Figure 21:
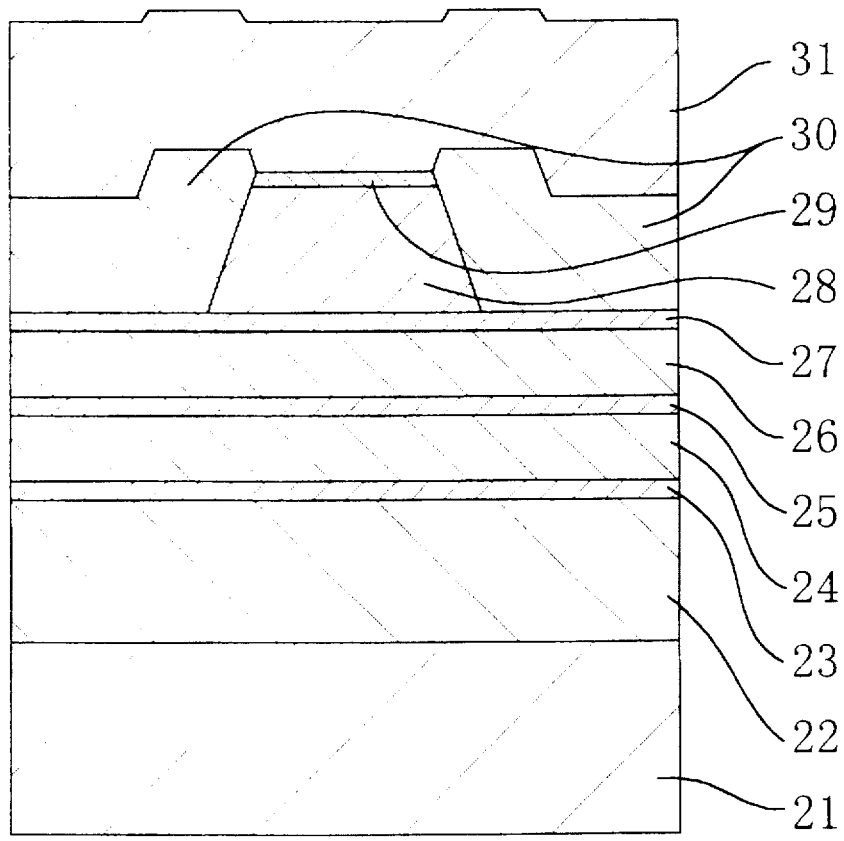
FIG. 21 is a cross-sectional view of a second conventional semiconductor laser device.

FIG. 19 shows current-versus-light-output characteristics in the case of using the active layer of multiple-quantum-well (MQW) structure exhibiting laser oscillation at a wavelength of about 780 nm and including a well layer having a thickness of 10 nm and consisting of three layers composed of $Ga_{0.95}Al_{0.05}As$ and a barrier layer having a thickness of 4 nm and consisting of four layers composed of $Ga_{0.7}Al_{0.3}As$. As shown in the drawing, the active layer of MQW structure produced a light output of 100 mW or higher.

When the active layer is provided with the multiple-quantum-well structure, the differential gain of the active layer is further increased, so that the region in which self-sustained pulsation occurs is further increased without causing non-linearity in the current-versus-light-output characteristics. In the case where the active layer has a multiple-quantum-well structure, if a plurality of loss varying layers are provided, the total thickness of the plurality of loss varying layers is adjusted to be equal to or less than a thickness obtained by adding 5 nm to one fifth of the total thickness of the well layer of the active layer. On the other hand, if the loss varying layer has a quantum well structure, the total thickness of the well layer of the loss varying layer is adjusted to be equal to or less than a thickness obtained by adding 5 nm to one fifth of the total thickness of the well layers of the active layer. In either case, non-linearity is less likely to appear in the current-versus-light-output characteristics.

The active layer may have another multiple-quantum-well layer such as a single-quantum well (SQW) structure, double-quantum well (DQW) structure, triple-quantum well (TQW) structure, GRIN structure, or separate confinement hetero (SCH) structure.

When the current blocking layers are fabricated on a semiconductor layer which facilitates regrowth process, i.e., a semiconductor layer with a low AlAs mole fraction, regrowth on the semiconductor layer with a low AlAs mole fraction prevents oxidation at the regrowth interface, which inevitably leads to a reduced interface resistance.

Although each of the above embodiments has shown the case where a GaAlAs-based semiconductor material is used, it will be appreciated that a compound semiconductor material containing InP, InGaAsP, InGaP, InGaAlP, ZnSe, ZnCdSSe, ZnMgSSe, GaN, InGaN, or AlGaN as the main component may also be used instead.

We claim:

1. A semiconductor laser device comprising:
   a first optical guiding layer composed of a semiconductor layer of first conductivity type formed on a semiconductor substrate;
   an active layer composed of a semiconductor layer formed on said first optical guiding layer;
   a second optical guiding layer composed of a semiconductor layer of second conductivity type formed on said active layer;
   a loss varying layer composed of a semiconductor layer of second conductivity type formed on said second optical guiding layer, said loss varying layer absorbing a lasing light from said active layer;
   a stripe region composed of a semiconductor layer of second conductivity type formed on the central portion of said loss varying layer;
   current blocking layers composed of semiconductor layers of first conductivity type formed on both sides of said stripe region on said loss varying layer and having a refractive index lower than a refractive index of said first optical guiding layer; and
   a third optical guiding layer composed of a semiconductor layer of second conductivity type formed over said stripe region and said current blocking layers, wherein
   the thickness of said loss varying layer ranges between 5 nm and a thickness obtained by adding 5 nm to one-fifth of the thickness of said active layer and
   the total thickness of said second optical guiding layer and said loss varying layer is 0.15 μm or less.

2. A semiconductor laser device according to claim 1, wherein
   said loss varying layer has a quantum well structure.

3. A semiconductor laser device according to claim 1, wherein
said active layer has a multiple-quantum-well structure.

4. A semiconductor laser device according to claim 1, wherein
said loss varying layer has a quantum well structure and said active layer has a multiple-quantum-well structure.

5. A semiconductor laser device comprising:
a first optical guiding layer composed of a semiconductor layer of first conductivity type formed on a semiconductor substrate;
an active layer composed of a semiconductor layer formed on said first optical guiding layer;
a second optical guiding layer composed of a semiconductor layer of second conductivity type formed on said active layer;
a stripe region composed of a semiconductor layer of second conductivity type formed on the central portion of said second optical guiding layer;
current blocking layers composed of semiconductor layers of first conductivity type formed on both sides of said stripe region on said second optical guiding layer and having a refractive index lower than a refractive index of said first optical guiding layer; and
a third optical guiding layer composed of a semiconductor layer of second conductivity type formed over said stripe region and said current blocking layers, wherein
said first optical guiding layer has at least one loss varying layer absorbing a lasing Light from said active layer
the thickness of said loss varying layer ranges between 5 nm and a thickness obtained by adding 5 nm to one fifth of the thickness of said active layer and
the thickness of said second optical guiding layer is 0.15 µm or less.

6. A semiconductor laser device according to claim 5, wherein
said loss varying layer has a quantum well structure.

7. A semiconductor laser device according to claim 5, wherein
said active layer has a multiple-quantum-well structure.

8. A semiconductor laser device according to claim 5, wherein
said loss varying layer has a quantum well structure and said active layer has a multiple-quantum-well structure.

9. A semiconductor laser device comprising:
a first optical guiding layer composed of a semiconductor layer of first conductivity type formed on a semiconductor substrate;
an active layer composed of a semiconductor layer formed on said first optical guiding layer;
a second optical guiding layer composed of a semiconductor layer of second conductivity type formed on said active layer;
a third optical guiding layer composed of a semiconductor layer of second conductivity type formed on said second optical guiding layer, said third optical guiding layer becoming transparent to a lasing light from said active layer;
a stripe region composed of a semiconductor layer of second conductivity type formed on the central portion of said third optical guiding layer;
current blocking layers composed of semiconductor layers of first conductivity type formed on both sides of said stripe region on said third optical guiding layer and having a refractive index lower than a refractive index of said first optical guiding layer; and
a fourth optical guiding layer composed of a semiconductor layer of second conductivity type formed over said stripe region and said current blocking layers, wherein
said first optical guiding layer has at least one loss varying layer absorbing a lasing light from said active layer
the thickness of said loss varying layer ranges between 5 nm and a thickness obtained by adding 5 nm to one fifth of the thickness of said active layer and
the total thickness of said second optical guiding layer and said third optical guiding layer is 0.15 µm or less.

10. A semiconductor laser device according to claim 9, wherein
said loss varying layer has a quantum well structure.

11. A semiconductor laser device according to claim 9, wherein
said active layer has a multiple-quantum-well structure.

12. A semiconductor laser device according to claim 9, wherein
said loss varying layer has a quantum well structure and said active layer has a multiple-quantum-well structure.

13. A semiconductor laser device comprising:
a first optical guiding layer composed of a semiconductor layer of first conductivity type formed on a semiconductor substrate;
an active layer composed of a semiconductor layer formed on said first optical guiding layer;
a second optical guiding layer composed of a semiconductor layer of second conductivity type formed on said active layer;
a stripe region composed of a semiconductor layer of second conductivity type formed on the central portion of said second optical guiding layer;
current blocking layers composed of semiconductor layers of first conductivity type formed on both sides of said stripe region on said second optical guiding layer and having a refractive index lower than a refractive index of said first optical guiding layer; and
a third optical guiding layer composed of a semiconductor layer of second conductivity type formed over said stripe region and said current blocking layers, wherein
said second optical guiding layer has at least one loss varying layer absorbing a lasing light from said active layer
the thickness of said loss varying layer ranges between 5 nm and a thickness obtained by adding 5 nm to one fifth of the thickness of said active layer and
the thickness of said second optical guiding layer including said loss varying layer is 0.15 µm or less.

14. A semiconductor laser device according to claim 13, wherein
said loss varying layer has a quantum well structure.

15. A semiconductor laser device according to claim 13, wherein
said active layer has a multiple-quantum-well structure.

16. A semiconductor laser device according to claim 13, wherein
said loss varying layer has a quantum well structure and said active layer has a multiple-quantum-well structure.

17. A semiconductor laser device comprising:
a first optical guiding layer composed of a semiconductor layer of first conductivity type formed on a semiconductor substrate;

an active layer composed of a semiconductor layer formed on said first optical guiding layer;

a second optical guiding layer composed of a semiconductor layer of second conductivity type formed on said active layer;

a third optical guiding layer composed of a semiconductor layer of second conductivity type formed on said second optical guiding layer, said third optical guiding layer becoming transparent to a lasing light from said active layer;

a stripe region composed of a semiconductor layer of second conductivity type formed on the central portion of said third optical guiding layer;

current blocking layers composed of semiconductor layers of first conductivity type formed on both sides of said stripe region on said third optical guiding layer and having a refractive index lower than a refractive index of said first optical guiding layer; and another third optical guiding layer composed of a semiconductor layer of second conductivity type formed over said stripe region and said current blocking layers, wherein said second optical guiding layer has at least one loss varying layer absorbing a lasing light from said active layer the thickness of said loss varying layer ranges between 5 nm and a thickness obtained by adding 5 nm to one fifth of the thickness of said active layer and the total thickness of said second optical guiding layer including said loss varying layer and said third optical guiding layer is 0.15 μm or less.

18. A semiconductor laser device according to claim 17, wherein said loss varying layer has a quantum well structure.

19. A semiconductor laser device according to claim 17, wherein said active layer has a multiple-quantum-well structure.

20. A semiconductor laser device according to claim 17, wherein said loss varying layer has a quantum well structure and said active layer has a multiple-quantum-well structure.

21. A semiconductor laser device comprising:

a first optical guiding layer composed of a semiconductor layer of first conductivity type formed on a semiconductor substrate;

an active layer composed of a semiconductor layer formed on said first optical guiding layer;

a second optical guiding layer composed of a semiconductor layer of second conductivity type formed on said active layer;

a stripe region composed of a semiconductor layer of second conductivity type formed on the central portion of said second optical guiding layer;

current blocking layers composed of semiconductor layers of first conductivity type formed on both sides of said stripe region on said second optical guiding layer and having a refractive index lower than a refractive index of said first optical guiding layer; and a third optical guiding layer composed of a semiconductor layer of second conductivity type formed over said stripe region and said current blocking layers, wherein said third optical guiding layer has at least one loss varying layer absorbing a lasing light from said active layer the thickness of said loss varying layer ranges between 5 nm and a thickness obtained by adding 5 nm to one fifth of the thickness of said active layer and the thickness of said second optical guiding layer is 0.15 μm or less.

22. A semiconductor laser device according to claim 21, wherein said loss varying layer has a quantum well structure.

23. A semiconductor laser device according to claim 21, wherein said active layer has a multiple-quantum-well structure.

24. A semiconductor laser device according to claim 21, wherein said loss varying layer has a quantum well structure and said active layer has a multiple-quantum-well structure.

25. A semiconductor laser device comprising:

a first optical guiding layer composed of a semiconductor layer of first conductivity type formed on a semiconductor substrate;

an active layer composed of a semiconductor layer formed on said first optical guiding layer;

a second optical guiding layer composed of a semiconductor layer of second conductivity type formed on said active layer;

a third optical guiding layer composed of a semiconductor layer of second conductivity type formed on said second optical guiding layer, said third optical guiding layer becoming transparent to a lasing light from said active layer;

a stripe region composed of a semiconductor layer of second conductivity type formed on the central portion of said third optical guiding layer;

current blocking layers composed of semiconductor layers of first conductivity type formed on both sides of said stripe region on said third optical guiding layer and having a refractive index lower than a refractive index of said first optical guiding layer; and a fourth optical guiding layer composed of a semiconductor layer of second conductivity type formed over said stripe region and said current blocking layers, wherein said fourth optical guiding layer has at least one loss varying layer absorbing the lasing light from said active layer, the thickness of said loss varying layer ranges between 5 nm and a thickness obtained by adding 5 nm to one fifth of the thickness of said active layer and the total thickness of said second optical guiding layer and said third optical guiding layer is 0.15 μm or less.

26. A semiconductor laser device according to claim 25, wherein said loss varying layer has a quantum well structure.

27. A semiconductor laser device according to claim 25, wherein said active layer has a multiple-quantum-well structure.

28. A semiconductor laser device according to claim 25, wherein said loss varying layer has a quantum well structure and said active layer has a multiple-quantum-well structure.

* * * * *